United States Patent
Fujimura et al.

(10) Patent No.: US 12,418,238 B2
(45) Date of Patent: Sep. 16, 2025

(54) POWER SUPPLY DEVICE

(71) Applicant: Rohm Co., Ltd., Kyoto (JP)

(72) Inventors: Daigo Fujimura, Kyoto (JP); Seiichi Yamamoto, Kyoto (JP)

(73) Assignee: Rohm Co., Ltd., Kyoto (JP)

( * ) Notice: Subject to any disclaimer, the term of this patent is extended or adjusted under 35 U.S.C. 154(b) by 34 days.

(21) Appl. No.: 18/275,278

(22) PCT Filed: Nov. 19, 2021

(86) PCT No.: PCT/JP2021/042637
§ 371 (c)(1),
(2) Date: Aug. 1, 2023

(87) PCT Pub. No.: WO2022/168403
PCT Pub. Date: Aug. 11, 2022

(65) Prior Publication Data
US 2024/0072656 A1    Feb. 29, 2024

(30) Foreign Application Priority Data

Feb. 3, 2021    (JP) .................................. 2021-015666

(51) Int. Cl.
*H02M 3/07*    (2006.01)
*G11C 5/14*    (2006.01)
*H02M 1/14*    (2006.01)

(52) U.S. Cl.
CPC ............... *H02M 3/07* (2013.01); *G11C 5/145* (2013.01); *H02M 1/143* (2013.01)

(58) Field of Classification Search
None
See application file for complete search history.

(56) References Cited

U.S. PATENT DOCUMENTS 5,553,021 A * 9/1996 Kubono ................. G11C 5/145
                                                    365/185.33
5,946,258 A * 8/1999 Everett ................... G11C 16/30
                                                    365/210.1
(Continued)

FOREIGN PATENT DOCUMENTS

JP    3773718    5/2006
JP    5940691    6/2016

OTHER PUBLICATIONS

International Search Report in International Appln. No. PCT/JP2021/042637, mailed on Feb. 8, 2022, 5 pages (with English translation).

*Primary Examiner* — Thomas J. Hiltunen
(74) *Attorney, Agent, or Firm* — Fish & Richardson P.C.

(57) ABSTRACT

An output voltage is stabilized at a predetermined target voltage by using a charge pump circuit. A first voltage divider that is arranged between an output line to which the output voltage is applied and a feedback line and that generates a first division voltage commensurate with the output voltage and a second voltage divider arranged between the feedback line and the ground and that generates a second division voltage commensurate with the output voltage are provided to generate on the feedback line, as a feedback voltage, a voltage lower than the output voltage by the first division voltage. The second voltage divider includes an N-type particular transistor whose gate receives a reference voltage and whose drain is connected to the feedback line.

10 Claims, 16 Drawing Sheets

(56) References Cited

U.S. PATENT DOCUMENTS

| | | | | |
|---|---|---|---|---|
| 6,031,397 | A * | 2/2000 | Banba | G11C 5/145 |
| | | | | 327/80 |
| 6,519,191 | B1 * | 2/2003 | Morishita | G11C 5/145 |
| | | | | 365/189.11 |
| 8,022,749 | B2 * | 9/2011 | Schatzberger | H02M 3/073 |
| | | | | 327/539 |
| 8,283,969 | B2 * | 10/2012 | Okamoto | H03H 11/245 |
| | | | | 327/536 |
| 8,385,135 | B2 * | 2/2013 | Conte | G11C 5/145 |
| | | | | 323/311 |
| 8,692,608 | B2 * | 4/2014 | Chen | H02M 3/07 |
| | | | | 363/60 |
| 10,096,367 | B2 * | 10/2018 | Tanikawa | G11C 16/3418 |
| 11,070,128 | B2 * | 7/2021 | Rana | G11C 16/30 |
| 11,683,027 | B2 * | 6/2023 | Ji | H03K 5/1254 |
| | | | | 327/77 |
| 12,040,705 | B2 * | 7/2024 | Heubi | H02M 3/073 |
| 2021/0281171 | A1 * | 9/2021 | Shlomo | G11C 5/145 |

* cited by examiner

POWER SUPPLY DEVICE

CROSS REFERENCE OF RELATED APPLICATIONS

This application is a U.S. National Phase application under 35 U.S.C. § 371 of International Patent Application No. PCT/JP2021/042637 filed on Nov. 19, 2021, which claims the benefit of priority of Japanese Patent Application No. 2021-015666, filed on Feb. 3, 2021, the disclosure of which is incorporated herein by reference in its entirety.

TECHNICAL FIELD

The present disclosure relates to power supply devices.

BACKGROUND ART

Various integrated circuits and electronic devices incorporate power supply devices. A power supply device generates from an input voltage a stabilized output voltage with a desired voltage level. Using the output voltage, a load carries out a desired function.

For example, a semiconductor device that incorporates a non-volatile memory generally requires a plurality of voltages with different voltage levels. In that case, a plurality of power supply devices are provided to generate output voltages with the necessary voltage levels so that a plurality of output voltages with different voltage levels are supplied to memory blocks.

CITATION LIST

Patent Literature

Patent Document 1: JP 3773718
Patent Document 2: JP 5940691

SUMMARY OF DISCLOSURE

Technical Problem

When at the start-up of a power supply device the output voltage rises or falls toward the target voltage, what is called an overshoot or undershoot may occur. On the other hand, after the output voltage reaches the target voltage, the output voltage fluctuates around the target voltage, and this fluctuation is called ripples. An excessively large overshoot, undershoot, or ripple adversely affects the load that is supplied with the output voltage. For example, in a non-volatile memory as mentioned above, an excessively large overshoot, undershoot, or ripple may lead to an data read error.

The present disclosure is aimed at providing a power supply device that contributes to suppressing overshoots, undershoots, or ripples.

Solution to Problem

According to one aspect of the present disclosure, a power supply device includes: an output voltage generator configured to generate an output voltage higher than the potential of the ground by using a charge pump circuit; a feedback voltage generator configured to generate on a feedback line a feedback voltage commensurate with the output voltage; and a comparator configured to compare the feedback voltage with a predetermined reference voltage to output a comparison result signal reflecting the magnitude relationship between the feedback voltage and the reference voltage. The power supply device stabilizes the output voltage at a predetermined target voltage by making the charge pump circuit operative or inoperative based on the comparison result signal. The feedback voltage generator includes: a first voltage divider arranged between an output line to which the output voltage is applied and the feedback line, the first voltage divider being configured to generate a first division voltage commensurate with the output voltage; and a second voltage divider arranged between the feedback line and the ground, the second voltage divider being configured to generate a second division voltage commensurate with the output voltage. The feedback voltage generator generates on the feedback line, as the feedback voltage, a voltage lower than the output voltage by the first division voltage. The second voltage divider includes an N-channel particular transistor having: a gate receiving the reference voltage; and a drain connected to the feedback line.

According to another aspect of the present disclosure, a power supply device includes: an output voltage generator configured to generate an output voltage higher than the potential of the ground by using a charge pump circuit; a feedback voltage generator configured to generate on a feedback line a feedback voltage commensurate with the output voltage; and a comparator configured to compare the feedback voltage with a predetermined reference voltage to output a comparison result signal reflecting the magnitude relationship between the feedback voltage and the reference voltage. The power supply device stabilizes the output voltage at a predetermined target voltage by making the charge pump circuit operative or inoperative based on the comparison result signal. The comparator includes: a differential input stage configured to receive the reference voltage and the feedback voltage to generate at a first node a differential signal commensurate with the difference between the reference voltage and the feedback voltage; and an output stage configured to generate at a second node, as the comparison result signal, a binary signal reflecting the differential signal. A clamping element configured to limit the amplitude of the differential signal is inserted between the first and second nodes.

According to yet another aspect of the present disclosure, a power supply device includes: an output voltage generator configured to generate an output voltage lower than the potential of the ground by using a charge pump circuit; a feedback voltage generator configured to generate on a feedback line a feedback voltage commensurate with the output voltage; and a comparator configured to compare the feedback voltage with a predetermined reference voltage to output a comparison result signal reflecting the magnitude relationship between the feedback voltage and the reference voltage. The power supply device stabilizes the output voltage at a predetermined target voltage by making the charge pump circuit operative or inoperative based on the comparison result signal. The comparator includes: a differential input stage configured to receive the reference voltage and the feedback voltage to generate at a first node a differential signal commensurate with the difference between the reference voltage and the feedback voltage; and an output stage configured to generate at a second node, as the comparison result signal, a binary signal reflecting the differential signal. A clamping element configured to limit the amplitude of the differential signal is inserted between the first and second nodes.

According to still another aspect of the present disclosure, a power supply device includes: an output voltage generator configured to generate an output voltage lower than the potential of the ground by using a charge pump circuit; a feedback voltage generator configured to generate on a feedback line a feedback voltage commensurate with the output voltage; and a comparator configured to compare the feedback voltage with a predetermined reference voltage to output a comparison result signal reflecting the magnitude relationship between the feedback voltage and the reference voltage. The power supply device stabilizes the output voltage at a predetermined target voltage by making the charge pump circuit operative or inoperative based on the comparison result signal. The feedback voltage generator includes: a first voltage divider arranged between an output line to which the output voltage is applied and the feedback line, the first voltage divider being configured to generate a first division voltage commensurate with the output voltage; and a second voltage divider arranged between the feedback line and a power line to which a predetermined supply voltage is applied, the second voltage divider being configured to generate a second division voltage commensurate with the output voltage. The he feedback voltage generator generates on the feedback line, as the feedback voltage, a voltage higher than the output voltage by the first division voltage. The power supply device further comprises a feedback voltage adjuster configured, if the feedback voltage is higher than the reference voltage, to lower the feedback voltage by drawing from the feedback line a current commensurate with the difference between the reference voltage and the feedback voltage.

Advantageous Effects of Disclosure

According to the present disclosure, it is possible to provide a power supply device that contributes to suppressing overshoots, undershoots, or ripples.

DESCRIPTION OF EMBODIMENTS

Figure 1:
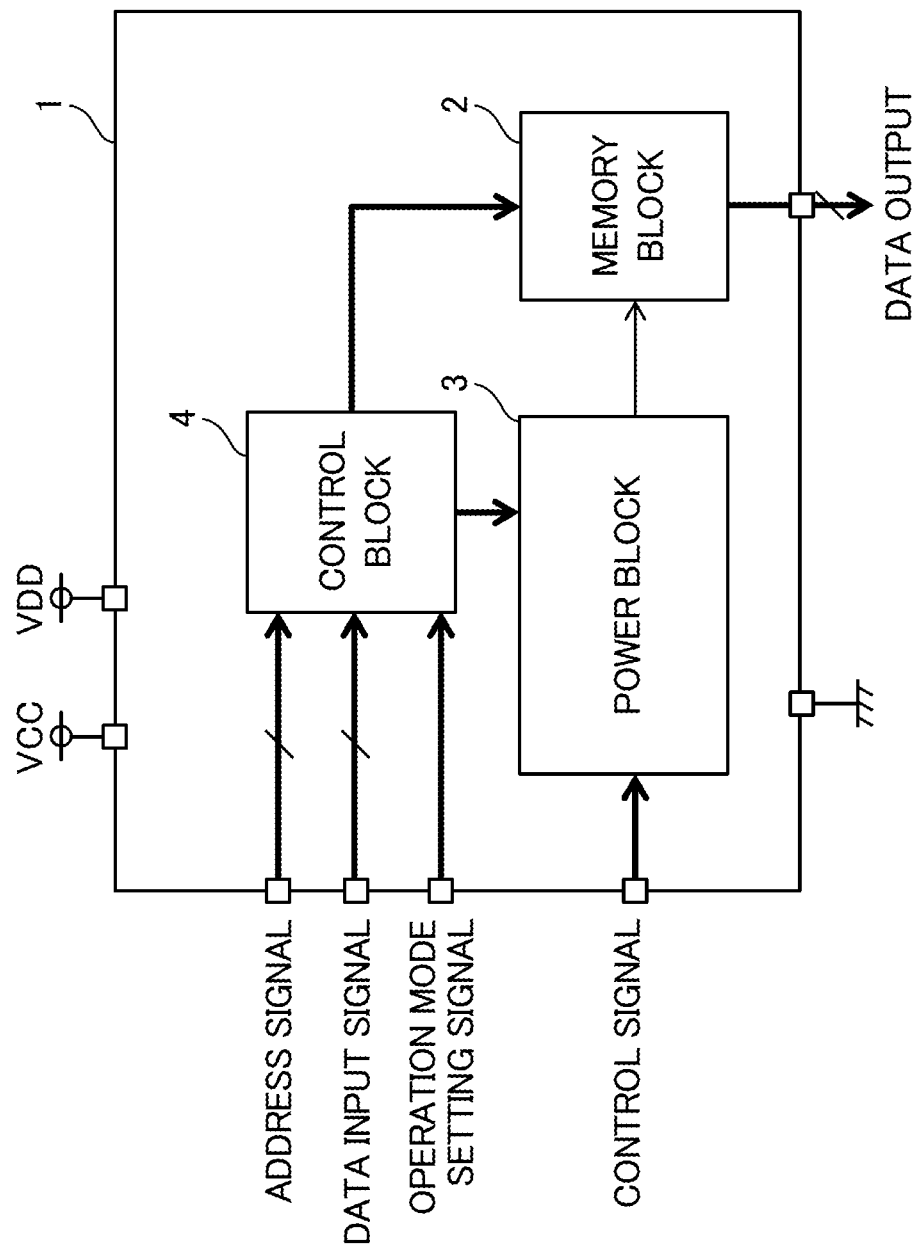
FIG. 1 is a schematic overall block diagram of a memory device according to an embodiment of the present disclosure.

Examples of implementing the present disclosure will be specifically described below with reference to the accompanying drawings. Among the diagrams referred to in the course, the same parts are identified by the same reference signs, and in principle no overlapping description of the same parts will be repeated. In the present description, for the sake of simplicity, symbols and reference signs referring to information, signals, physical quantities, elements, parts, and the like are occasionally used with omission or abbreviation of the names of the information, signals, physical quantities, elements, parts, and the like corresponding to those symbols and reference signs. For example, the differential signal described later and identified by the reference sign "c1" (see FIGS. 7 and 8B) is sometimes referred to as the differential signal $c1$ and other times abbreviated to the signal $c1$, both referring to the same entity.

First, some of the terms used to describe embodiments of the present disclosure will be defined. "Line" denotes a wiring across or to which an electrical signal is passed or applied. "Ground" denotes a reference conductor at a reference potential of 0 V (zero volts), or to a potential of 0 V itself. A reference conductor is formed of an electrically conductive material such as metal. A potential of 0 V is occasionally referred to as a ground potential. In embodiments of the present disclosure, any voltage mentioned with no particular reference mentioned is a potential relative to the ground.

"Level" denotes the level of a potential, and for any signal or voltage of interest, "high level" has a higher potential than "low level". For any signal or voltage of interest, its being at high level means, more precisely, its level being equal to high level, and its being at low level means, more precisely, its level being equal to low level. A level of a signal is occasionally referred to as a signal level, and a level of a voltage is occasionally referred to as a voltage level. For any signal of interest, if the signal is at high level, its inversion signal is at low level, and if the signal is at low level its inversion signal is at high level. For any signal that takes as its signal level either high or low level, a period in which the signal takes high level is referred to as a high-level period, and a period in which the signal takes low level is referred to as a low-level period. Similar definitions apply to any voltage that takes as its voltage level either high or low level.

For any transistor configured as an FET (field-effect transistor), which can be a MOSFET, "on state" refers to a state where the drain-source channel of the transistor is conducting, and "off state" refers to a state where the drain-source channel of the transistor is not conducting (cut off). Similar definitions apply to any transistor that is not classified as an FET. Unless otherwise stated, any MOSFET can be understood to be an enhancement MOSFET. "MOSFET" is an abbreviation of "metal-oxide-semiconductor field-effect transistor".

The electrical characteristics of a MOSFET include gate threshold voltage. For any transistor that is an N-channel enhancement MOSFET, when the gate potential of the transistor is higher than the source potential of the transistor and the magnitude of the gate-source voltage (the gate potential relative to the source potential) of the transistor is equal to or higher than the gate threshold voltage of the transistor, the transistor is in the on state; otherwise, the transistor is in the off state. For any transistor that is a P-channel enhancement MOSFET, when the gate potential of the transistor is lower than the source potential of the transistor and the magnitude of the gate-source voltage (the gate potential relative to the source potential) of the transistor is equal to or higher than the gate threshold voltage of the transistor, the transistor is in the on state; otherwise, the transistor is in the off state. In the following description, for any transistor, its being in the on or off state is occasionally expressed simply as its being on or off respectively. Wherever "connection" is discussed among a plurality of parts constituting a circuit, as among given circuit elements, conductors (lines), nodes, and the like, the term is to be understood to denote "electrical connection".

FIG. 1 is a schematic overall block diagram of a memory device 1 according to an embodiment of the present disclosure. The memory device 1 includes a memory block 2, a power block 3, and a control block 4. The memory device 1 is supplied with two supply voltages VCC an VDD from the outside. The supply voltages VCC and VDD are mutually different positive direct-current voltages.

The memory block 2 has a plurality of memory cells arrayed in a matrix along a first and a second direction. Each memory cell stores the value of "0" or "1" in a non-volatile manner. The memory device 1 is an MTP (multiple-time programmable) memory, which is a kind of non-volatile memory, and accordingly permits the data stored in each memory cell to be rewritten multiple times. An operation to write the data of "1" or "0" to a memory cell taken as the target of data writing is called a write operation. The write operation can be a program operation or an erase operation. The program operation denotes an operation to write the data of "1" to a memory cell taken as the target of data writing. The erase operation denotes an operation to write the data of "0" to a memory cell taken as the target of data writing. Incidentally, an operation to read the data stored in a memory cell taken as the target of data reading is called a read operation.

Carrying out the write operation (program operation or erase operation) requires a plurality of write voltages with different voltage levels. These write voltages include voltages VI, VP, and VM (see FIG. 2), described later, that are generated in the power block 3. Incidentally, the read operation requires none of the write voltages. When the read operation is performed, the supply voltages VCC and VDD are supplied to the memory block 2 and thereby the read operation is carried out.

The control block 4 is fed with an address signal, a data input signal, and an operation mode setting signal from the outside. The operation mode setting signal is a signal that specifies which of the write and read operations to perform in the memory block 2. The memory block 2 has a plurality of addresses defined in it, and each memory cell is assigned one of those addresses. The address signal specifies the address in the memory block 2 that is taken as the target of data writing or data reading. The data input signal specifies the data to be written to the memory cell at the address specified as the target of data writing.

Based on the address signal, the data input signal, and the operation mode setting signal, the control block 4 controls the memory block 2 and the power block 3 so that data is written to the memory block 2 by the program or erase operation or that data is read from the memory block 2 by the read operation. When data is written to the memory block 2, the control block 4 controls the power block 3 so that it generates the plurality of write voltages mentioned above. From outside the memory device 1, the power block 3 is fed with control signals, including the operation mode setting signal, for controlling the operation of the power block 3.

Figure 2:
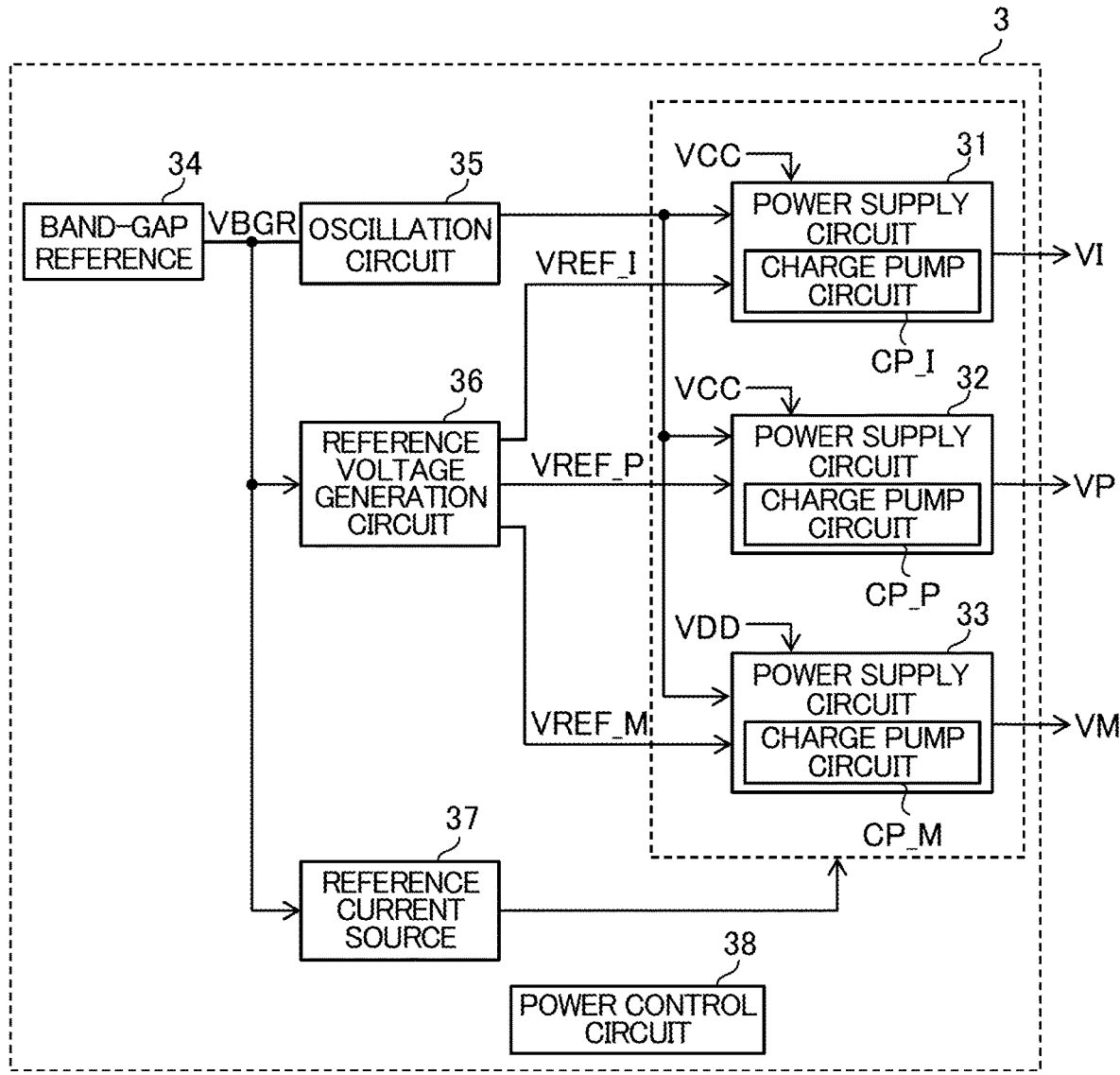
FIG. 2 is an internal configuration diagram of a power block provided in a memory device according to an embodiment of the present disclosure.

FIG. 2 is an internal configuration diagram of the power block 3. The power block 3 includes power supply circuits 31 to 33, a band-gap reference 34, an oscillation circuit 35, a reference voltage generation circuit 36, a reference current source 37, and a power control circuit 38. Each of the power supply circuits 31 to 33 can be called a power supply device.

The band-gap reference 34 generates, based on the supply voltage VCC or VDD, a voltage VBGR (e.g., 1.25 V), which is a predetermined positive direct-current voltage. Using the voltage VBGR, the oscillation circuit 35 generates a clock signal, which is a rectangular-wave signal at a predetermined clock frequency. The reference voltage generation circuit 36 generates, based on the voltage VBGR, three reference voltages VREF_I, VREF_P, and VREF_M. These reference voltages each have a positive direct-current voltage value. The reference voltage generation circuit 36 can generate the reference voltages VREF_I, VREF_P, and VREF_M by dividing the voltage VBGR. It is here assumed that the reference voltages VREF_I, VREF_P, and VREF_M have mutually different values, but two or more of them may have equal values. The reference current source 37 supplies the power supply circuits 31 to 33 with a constant current used in the power supply circuits 31 to 33. The power control circuit 38 comprehensively controls the operation of different parts in the power block 3.

Figure 3A:
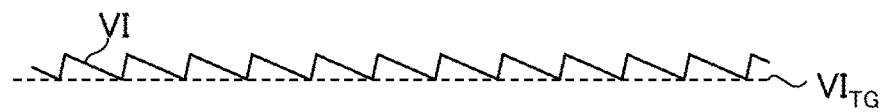
FIG. 3A is a diagram showing an outline of the output voltage waveform of a power supply circuit in a power block according to an embodiment of the present disclosure.

The power supply circuit 31 generates an output voltage VI using the supply voltage VCC. When the power supply circuit 31 is operating, the output voltage VI has a positive voltage value; that is, the power supply circuit 31 generates an output voltage VI higher than the potential of the ground. The power supply circuit 31 includes a charge pump circuit CP_I and, by making it operate with appropriate timing using the clock signal fed from the oscillation circuit 35, raises the output voltage VI. Within the power supply circuit 31, a feedback voltage commensurate with the output voltage VI is generated, and feedback control is performed such that the feedback voltage equals the reference voltage VREF_I. The feedback control makes the charge pump circuit CP_I in the power supply circuit 31 operative and inoperative alternately (switches it between an operative and an inoperative state). In the power supply circuit 31, with the charge pump circuit CP_I operative, the output voltage VI rises; with the charge pump circuit CP_I inoperative, the output voltage VI falls gradually due to a leak current and the like in the circuit elements that are supplied with the output voltage VI. As the output voltage VI rises and falls, the feedback voltage, which is commensurate with the output voltage VI, rises and falls together. In this way, the output voltage VI is stabilized at a target voltage $VI_{TG}$ commensurate with the reference voltage VREF_I. The output voltage VI being stabilized at the target voltage $VI_{TG}$ means that the average of the output voltage VI is kept substantially at or close to the target voltage $VI_{TG}$. With the output voltage VI stabilized at a target voltage $VI_{TG}$, as shown in FIG. 3A, the output voltage VI fluctuates relative to the target voltage $VI_{TG}$ (e.g., with the target voltage $VI_{TG}$ as the lower limit of its fluctuation).

Figure 3B:
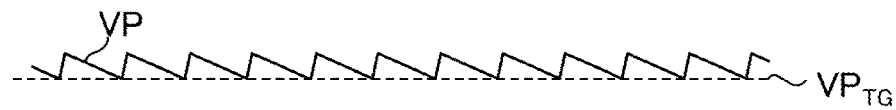
FIG. 3B is a diagram showing an outline of the output voltage waveform of a power supply circuit in a power block according to an embodiment of the present disclosure.

The power supply circuit 32 generates an output voltage VP using the supply voltage VCC. When the power supply circuit 32 is operating, the output voltage VP has a positive voltage value; that is, the power supply circuit 32 generates an output voltage VP higher than the potential of the ground. The power supply circuit 32 includes a charge pump circuit CP_P and, by making it operate with appropriate timing using the clock signal fed from the oscillation circuit 35, raises the output voltage VP. Within the power supply circuit 32, a feedback voltage commensurate with the output voltage VP is generated, and feedback control is performed such that the feedback voltage equals the reference voltage VREF_P. The feedback control makes the charge pump circuit CP_P in the power supply circuit 32 operative and inoperative alternately (switches it between an operative and an inoperative state). In the power supply circuit 32, with the charge pump circuit CP_P operative, the output voltage VP rises; with the charge pump circuit CP_P inoperative, the output voltage VP falls gradually due to a leak current and the like in the circuit elements that are supplied with the output voltage VP. As the output voltage VP rises and falls, the feedback voltage, which is commensurate with the output voltage VP, rises and falls together. In this way, the output voltage VP is stabilized at a target voltage $VP_{TG}$ commensurate with the reference voltage VREF_P. The output voltage VP being stabilized at the target voltage $VP_{TG}$ means that the average of the output voltage VP is kept substantially at or close to the target voltage $VP_{TG}$. With the output voltage VP stabilized at the target voltage $VP_{TG}$, as shown in FIG. 3B, the output voltage VP fluctuates relative to the target voltage $VP_{TG}$ (e.g., with the target voltage $VP_{TG}$ as the lower limit of its fluctuation).

Figure 3C:
FIG. 3C is a diagram showing an outline of the output voltage waveform of a power supply circuit in a power block according to an embodiment of the present disclosure.

The power supply circuit 33 generates an output voltage VM using the supply voltage VDD. When the power supply circuit 33 is operating, the output voltage VM has a negative voltage value; that is, the power supply circuit 33 generates an output voltage VM lower than the potential of the ground. The power supply circuit 33 includes a charge pump circuit CP_M and, by making it operate with appropriate timing using the clock signal fed from the oscillation circuit 35, lowers the output voltage VM. Within the power supply circuit 33, a feedback voltage commensurate with the output voltage VM is generated, and feedback control is performed such that the feedback voltage equals the reference voltage VREF_M. The feedback control makes the charge pump circuit CP_M in the power supply circuit 33 operative and inoperative alternately (switches it between an operative and an inoperative state). In the power supply circuit 33, with the charge pump circuit CP_M operative, the output voltage VM falls; with the charge pump circuit CP_M inoperative, the output voltage VM rises gradually due to a leak current and the like in the circuit elements that are supplied with the output voltage VM. As the output voltage VM falls and rises, the feedback voltage, which is commensurate with the output voltage VM, falls and rises together. In this way, the output voltage VM is stabilized at a target voltage $VM_{TG}$ commensurate with the reference voltage VREF_M. The output voltage VM being stabilized at the target voltage $VM_{TG}$ means that the average of the output voltage VM is kept substantially at or close to the target voltage $VM_{TG}$. With the output voltage VM stabilized at the target voltage $VM_{TG}$, as shown in FIG. 3C, the output voltage VM fluctuates relative to the target voltage $VM_{TG}$ (e.g., with the target voltage $VM_{TG}$ as the upper limit of its fluctuation).

Figure 4A:
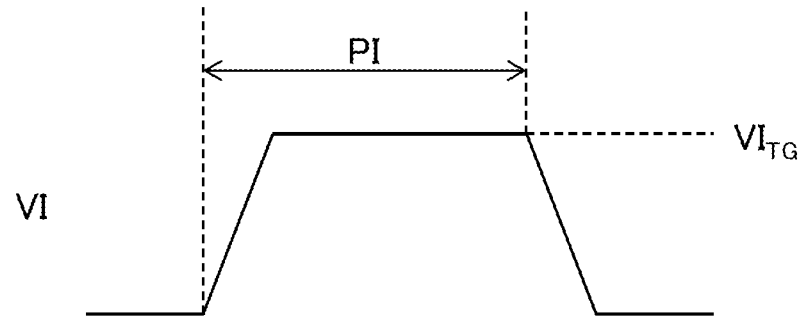
FIG. 4A is a diagram illustrating a power supply operation period in a power supply circuit according to an embodiment of the present disclosure.

With reference to FIG. 4A, a power supply operation period PI with respect to the output voltage VI is defined as follows. The start timing of the power supply operation period PI corresponds to the timing at which, as a result of the charge pump circuit CP_I in the power supply circuit 31 starting to operate, the output voltage VI starts to rise from a voltage sufficiently lower than the target voltage $VI_{TG}$ toward the target voltage $VI_{TG}$. After the start of the power supply operation period PI, the output voltage VI rises up to the target voltage $VI_{TG}$ and is stabilized at the target voltage $VI_{TG}$. After that, the charge pump circuit CP_I is kept inoperative, and thus the output voltage VI falls monotonically from the target voltage $VI_{TG}$ toward a voltage sufficiently lower than the target voltage $VI_{TG}$. The timing of the switch from the state where the output voltage VI is stabilized at the target voltage $VI_{TG}$ to the state where the charge pump circuit CP_I is kept inoperative corresponds to the end timing of the power supply operation period PI.

Figure 4B:
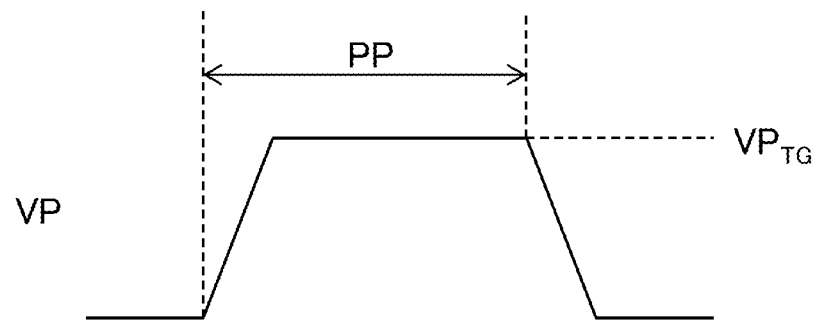
FIG. 4B is a diagram illustrating a power supply operation period in a power supply circuit according to an embodiment of the present disclosure.

With reference to FIG. 4B, a power supply operation period PP with respect to the output voltage VP is defined as follows. The start timing of the power supply operation period PP corresponds to the timing at which, as a result of the charge pump circuit CP_P in the power supply circuit 32 starting to operate, the output voltage VP starts to rise from a voltage sufficiently lower than the target voltage $VP_{TG}$ toward the target voltage $VP_{TG}$. After the start of the power supply operation period PP, the output voltage VP rises up to the target voltage $VP_{TG}$ and is stabilized at the target voltage $VP_{TG}$. After that, the charge pump circuit CP_P is kept inoperative, and thus the output voltage VP falls monotonically from the target voltage $VP_{TG}$ toward a voltage sufficiently lower than the target voltage $VP_{TG}$. The timing of the switch from the state where the output voltage VP is stabilized at the target voltage $VP_{TG}$ to the state where the charge pump circuit CP_P is kept inoperative corresponds to the end timing of the power supply operation period PP.

Figure 4C:
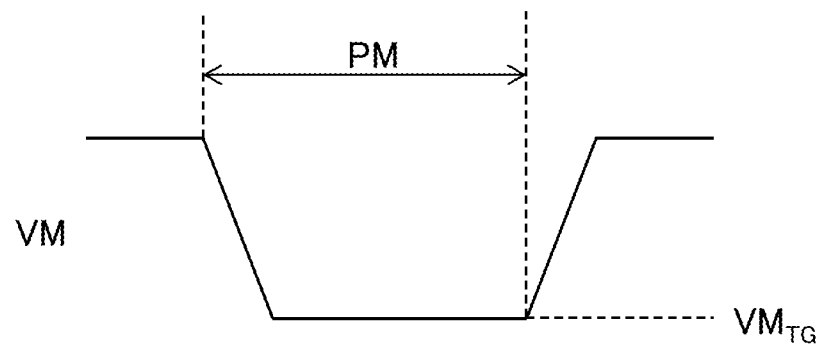
FIG. 4C is a diagram illustrating a power supply operation period in a power supply circuit according to an embodiment of the present disclosure.

With reference to FIG. 4C, a power supply operation period PM with respect to the output voltage VM is defined as follows. The start timing of the power supply operation period PM corresponds to the timing at which, as a result of the charge pump circuit CP_M in the power supply circuit 33 starting to operate, the output voltage VM starts to fall from a voltage sufficiently higher than the target voltage $VM_{TG}$ toward the target voltage $VM_{TG}$. After the start of the power supply operation period PM, the output voltage VM falls down to the target voltage $VM_{TG}$ and is stabilized at the target voltage $VM_{TG}$. After that, the charge pump circuit CP_M is kept inoperative, and thus the output voltage VM rises monotonically from the target voltage $VM_{TG}$ toward a voltage sufficiently higher than the target voltage $VM_{TG}$. The timing of the switch from the state where the output voltage VM is stabilized at the target voltage $VM_{TG}$ to the state where the charge pump circuit CP_M is kept inoperative corresponds to the end timing of the power supply operation period PM.

In a simple example, the start timings of the power supply operation periods PI, PP, and PM can be made coincide with each other, and the end timings of the power supply operation periods PI, PP, and PM can be made coincide. Instead, two or more of the start timings of the power supply operation periods PI, PP, and PM may be slightly shifted from each other; likewise, two or more of the end timings of the power supply operation periods PI, PP, and PM may be slightly shifted from each other. In any case, the power supply operation periods PI, PP, and PM share a period in which they overlap with each other and, within that overlap period, during the period in which the output voltages VI, VP, and VM are all stabilized at the target voltages $VI_{TG}$, $VP_{TG}$, and $VM_{TG}$ respectively (this period is hereinafter called the voltage-stabilized period), data is written to each memory cell by the program or erase operation.

The target voltage $VP_{TG}$ of the output voltage VP is higher than the target voltage $VI_{TG}$ of the output voltage VI. In the embodiment, the target voltage $VP_{TG}$ is assumed to be 12 V and the target voltage $VI_{TG}$ 5 V. On the other hand, the target voltage $VM_{TG}$ of the output voltage VM is assumed to be (−7 V). For example, the program operation is performed using the output voltages VI, VP, and VM during the voltage-stabilized period, and the erase operation is performed using the output voltages VP and VM during the voltage-stabilized period.

Figure 5:
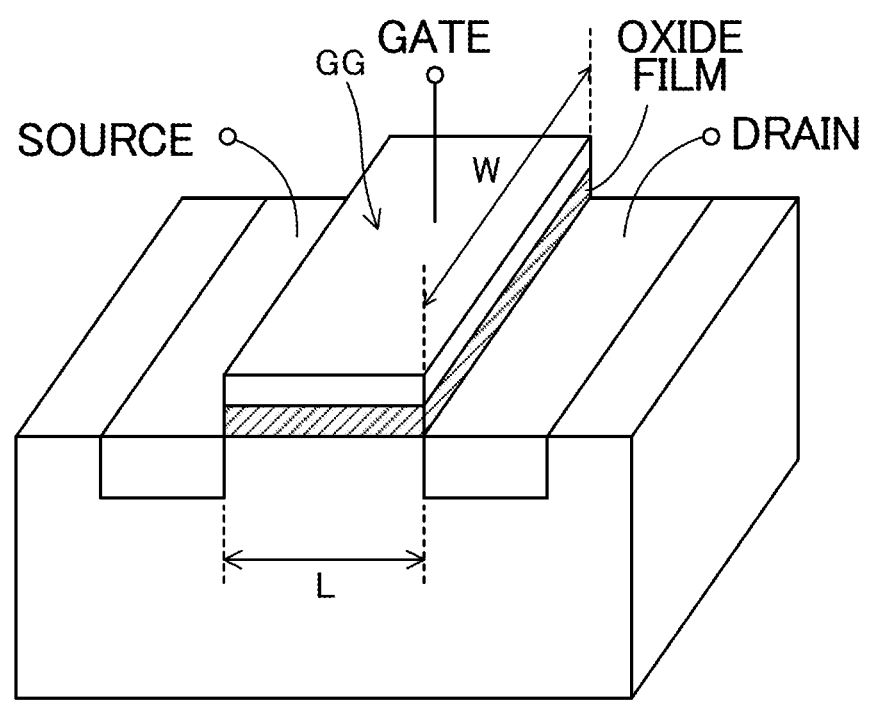
FIG. 5 is a diagram schematically showing the structure of a MOSFET according to an embodiment of the present disclosure.

The power supply circuits 31 to 33 are each configured with a plurality of MOSFETs. Although the gate width and the gate length of a MOSFET are defined and recognized in common technical knowledge about MOSFETs, the definitions of gate width and gate length will be reiterated. FIG. 5 schematically shows the structure of a MOSFET. In FIG. 5, the gate width is identified by the symbol "W" and the gate length with the symbol "L". The circuit elements of the memory device 1 are formed in an integrated fashion on a semiconductor substrate, and the structure of any transistor formed as a MOSFET on the semiconductor substrate is characterized by its gate width W and gate length L. Any transistor formed as a MOSFET has a gate electrode GG formed in it to function as its gate. The gate width W and the gate length L represent the size of the gate electrode GG in directions parallel to the surface (top and bottom faces) of the semiconductor substrate. Of the two, the gate length L is the distance between the drain and the source of the transistor (i.e., the dimension of the gate electrode GG along the direction pointing between the drain and the source); the gate width W is the dimension of the gate electrode GG in the direction orthogonal both to the direction in which the gate length L is defined (i.e., the direction pointing between the drain and the source) and to the direction normal to the semiconductor substrate (i.e., the direction orthogonal to the top and bottom faces of the semiconductor substrate). For any MOSFET, other conditions being equal, as the gate width W increases, the drain current increases and, with an adequately large gate length L, the drain current is generally proportional to the gate width W.

When during the power supply operation period PI the output voltage VI rising from a voltage sufficiently lower than the target voltage $VI_{TG}$ reaches the target voltage $VI_{TG}$, the output voltage VI may rise beyond the target voltage $VI_{TG}$, that is, an overshoot may occur. And, during the power supply operation period PI the output voltage VI having reached the target voltage $VI_{TG}$ fluctuates relative to the target voltage $VI_{TG}$, and this fluctuation is called ripples. An excessively large overshoot or ripple in the output voltage VI interferes with the normal operation of the memory cell (e.g., leading to a data read error). For this reason, overshoots and ripples in the output voltage VI have to be suppressed to be adequately low. The same applies to the output voltages VP and VM. Note however that the output voltage VM is subjected to, instead of overshoots, undershoots. That is, when during the power supply operation period PM the output voltage VM falling from a voltage sufficiently higher than the target voltage $VM_{TG}$ reaches the target voltage $VM_{TG}$, the output voltage VM may fall beyond the target voltage $VM_{TG}$, that is, an undershoot may occur. And, during the power supply operation period PM the output voltage VM having reached the target voltage $VM_{TG}$ fluctuates relative to the target voltage $VM_{TG}$, and this fluctuation is called ripples. An excessively large undershoot or ripple in the output voltage VM interferes with the normal operation of the memory cell (e.g., leading to a data read error). For this reason, undershoots and ripples in the output voltage VM have to be kept adequately low.

In the memory block 2, each memory cell is configured with a plurality of MOSFETs including floating-gate MOSFETs. When the write operation is performed, write voltages (VI, VP, and VM) are fed to the corresponding gates in each memory cell. In each memory cell, the gates are accompanied by a capacitance (parasitic capacitance), and this capacitance acts as a load capacitance with respect to the outputs of the power supply circuits 31 to 33. The load capacitance increases in proportion to the memory capacity of the memory block 2. The memory capacity of the memory block 2 corresponds to the total number of memory cells in the memory block 2 and is, for example, several kilobits or several tens of kilobits.

The power supply circuits 31 to 33 are preferably designed to be fit for the load capacitance. For example, if a configuration of the power supply circuit 31 designed to be fit for a memory block 2 with a first memory capacity is applied as it is to a memory block 2 with a second memory capacity lower than the first memory capacity, excessively large overshoots and ripples as mentioned above may result. The same applies to the power supply circuits 32 and 33. The first and second memory capacities are, for example, 64 kilobits and 2 kilobits respectively.

Now, by way of a plurality of practical examples, some specific examples of the configuration and operation of the memory device 1 will be presented along with applied and modified technologies associated with them. Unless otherwise stated or unless inconsistent, any description given above in connection with the embodiment applies to the practical examples presented below. For any description of the practical examples that contradicts what has been described above, the description given in connection with the practical examples can prevail. Unless inconsistent, any description given in connection with any one of the practical examples presented below applies to any other practical example (i.e., any two or more of the practical examples can be implemented in combination).

Practical Example EX_A

Figure 6:
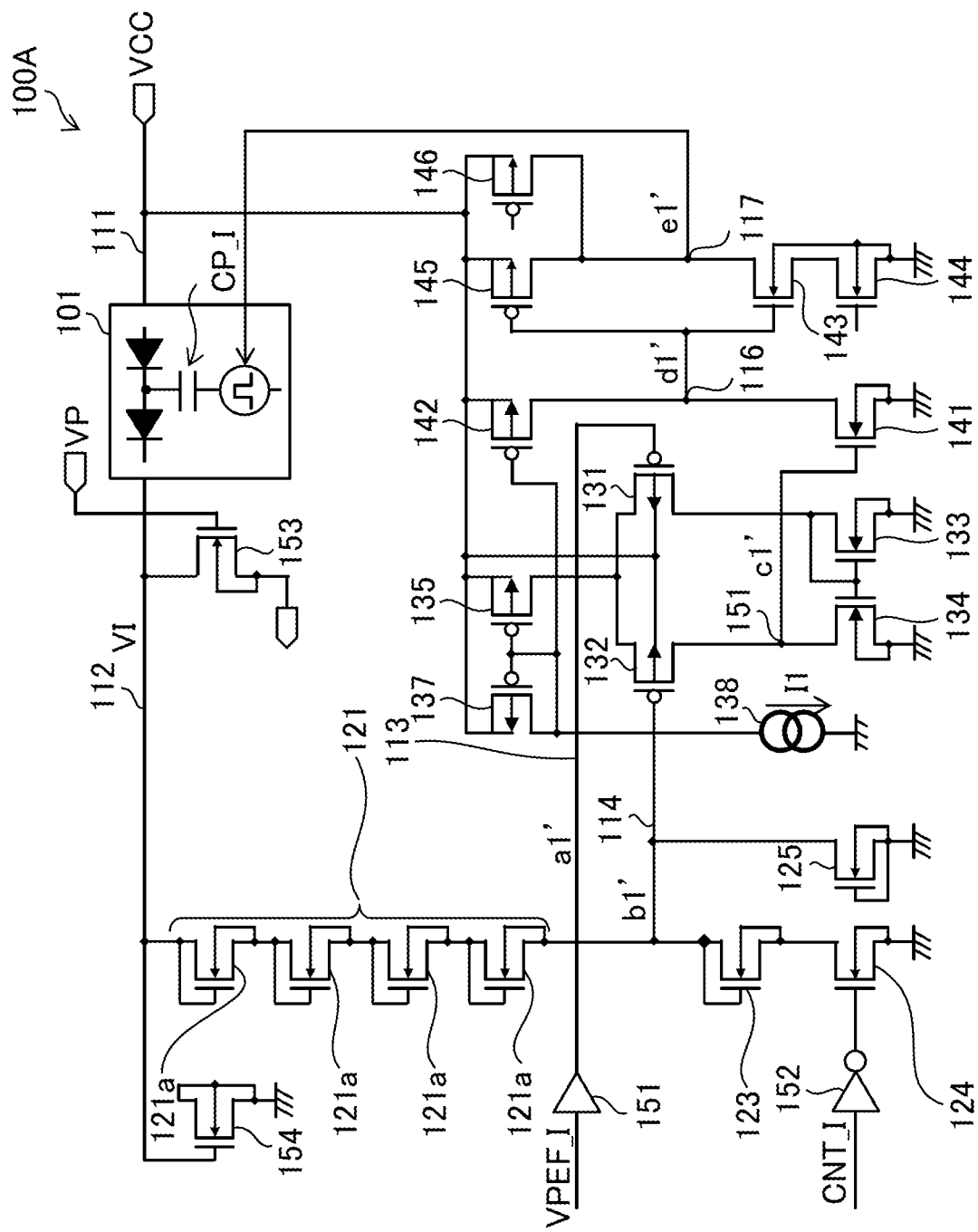
FIG. 6 is a circuit diagram of a power supply circuit according to Practical Example EX_1A belonging to an embodiment of the present disclosure.

Practical Example EX_1A will be described. FIG. 6 is a circuit diagram of a power supply circuit 100A according to Practical Example EX_1A. The power supply circuit 100A is designed as the power supply circuit 31 on the assumption that the memory block 2 has a first memory capacity (e.g., 64 kilobits). When one considers reducing the memory capacity of the memory block 2 from the first memory capacity (e.g., 64 kilobits) to a second memory capacity (e.g., 2 kilobits), the power supply circuit 100A leaves room for improvement in some aspects. The reason for that, as well as the configuration and characteristics of the power supply circuit 100A, will be clarified through the description of Practical Example EX_1B below.

Practical Example EX_1B

Figure 7:
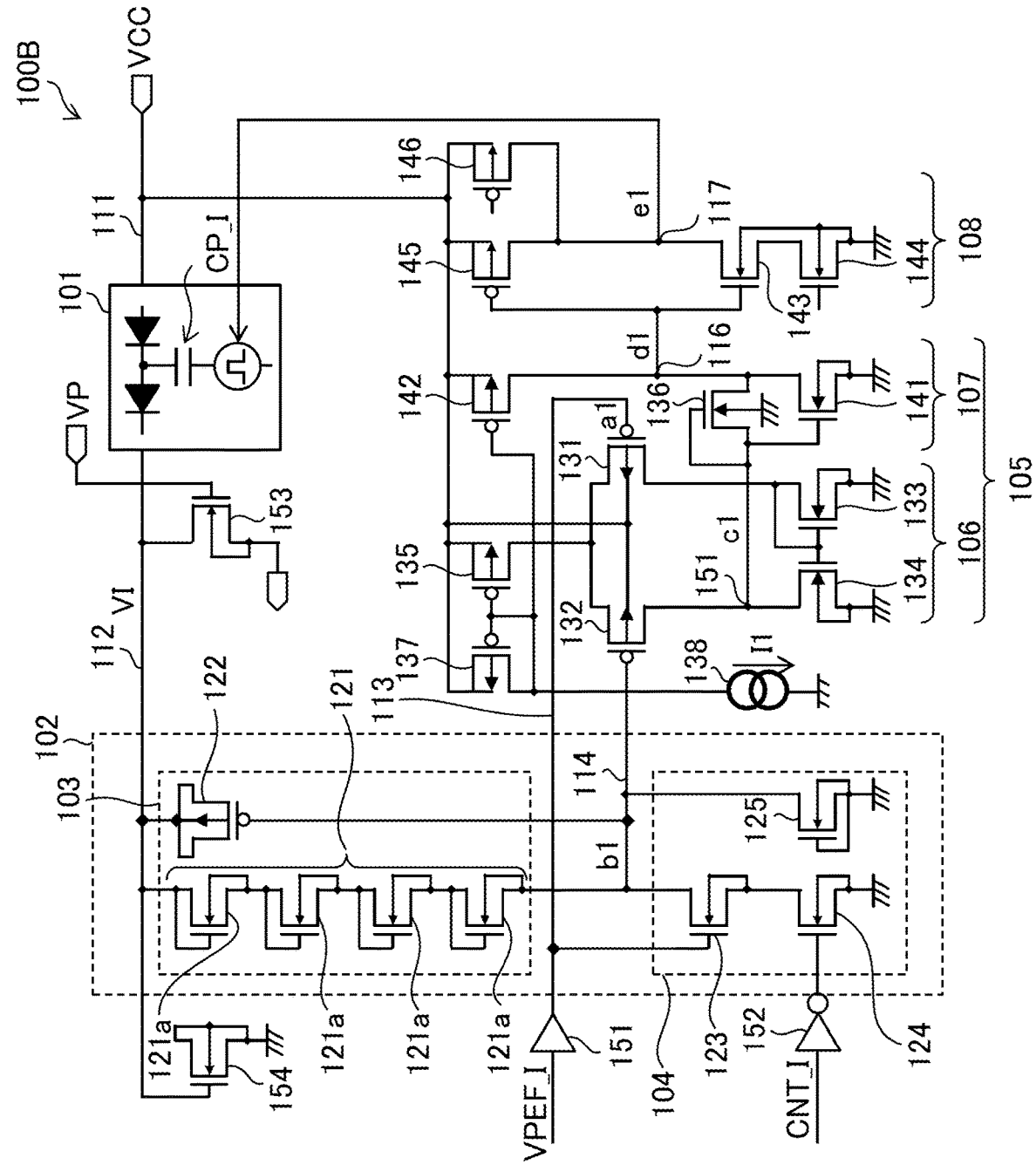
FIG. 7 is a circuit diagram of a power supply circuit according to Practical Example EX_1B belonging to an embodiment of the present disclosure.

Practical Example EX_1B will be described. FIG. 7 is a circuit diagram of a power supply circuit 100B according to Practical Example EX_1B. The power supply circuit 100B is designed as the power supply circuit 31 on the assumption that the memory block 2 has a second memory capacity (e.g., 2 kilobits). Unless otherwise stated, the operation of the power supply circuit 100B described in connection with this practical example is the operation of the power supply circuit 100B during the power supply operation period PI.

The power supply circuit 100B includes an output voltage generator 101, a feedback voltage generator 102, a comparator 105, and an inverter 108.

The output voltage generator 101 includes a charge pump circuit CP_I. The output voltage generator 101 is connected to a power line 111 and to an output line 112. The power line 111 is fed with the supply voltage VCC as an input voltage.

The output voltage generator 101 operates the charge pump circuit CP_I to generate, on the output line 112, an output voltage VI higher than the potential of the ground. The output voltage generator 101 can generate, using the supply voltage VCC, the output voltage VI relative to the supply voltage VCC. The supply voltage VCC can be used as a supply voltage to a driver (not illustrated) that feeds the charge pump circuit CP_I with a clock signal (in this case, the amplitude of the clock signal is equal to the magnitude of the supply voltage VCC). The feedback voltage generator 102 is connected to the output line 112, a reference line 113, a feedback line 114, and the ground, and generates, on the feedback line 114, a feedback voltage b1 commensurate with the output voltage VI. The comparator 105 compares the feedback voltage b1 with a predetermined reference voltage a1 to output a comparison result signal that reflects their magnitude relationship. The output voltage generator 101 makes the charge pump circuit CP_I operative or inoperative based on the comparison result signal and thereby stabilizes the output voltage VI at the target voltage $VI_{TG}$.

The feedback voltage generator 102 is configured as follows. The feedback voltage generator 102 includes a first voltage divider 103 arranged between the output line 112, to which the output voltage VI is fed, and the feedback line 114 to generate a first division voltage commensurate with the output voltage VI and a second voltage divider 104 arranged between the feedback line 114 and the ground to generate a second division voltage commensurate with the output voltage VI. The feedback voltage generator 102 thus generates on the feedback line 114, as the feedback voltage b1, a voltage lower than the output voltage VI by the first division voltage. The first division voltage commensurate with the output voltage VI appears between the output line 112 and the feedback line 114, and corresponds to the potential on the output line 112 relative to the potential on the feedback line 114 (i.e., the voltage difference (VI−b1)). The second division voltage commensurate with the output voltage VI appears between the feedback line 114 and the ground, and corresponds to the potential on the feedback line 114 relative to the potential of the ground (i.e., the feedback voltage b1). The output voltage VI corresponds to the sum of the first and second division voltages.

The first voltage divider 103 includes a circuit (DC-pass circuit) 121 that lets pass the direct-current component of the current between the output line 112 and the feedback line 114, and a feedback capacitive element 122 connected in parallel with the circuit 121. The circuit 121 is arranged between the output line 112 and the feedback line 114.

In the configuration example in FIG. 7, the circuit 121 is a series circuit of a plurality of diodes, and the forward direction of each diode in the circuit 121 points from the output line 112 to the feedback line 114. The diodes in the circuit 121 are each configured as a diode-connected MOSFET. That is, the circuit 121 is composed of a plurality of transistors 121a of which each is an N-channel MOSFET, each transistor 121a having its drain and gate connected together (so that each transistor 121a functions as a diode). In each transistor 121a, the back gate is connected to the source. In a case where the circuit 121 is composed of a first to an $n_I$-th transistor 121a (where $n_I$ is any integer of two or more), the drain of the first transistor 121a is connected to the output line 112, the source of the $n_I$-th transistor 121a is connected to the feedback line 114, and the source of the i-th transistor 121a and the drain of the (i+1)th transistor 121a are connected together (where i is any integer fulfilling $1 \le i \le (n_I-1)$). While in the configuration example in FIG. 7 four transistors 121a are connected in series (i.e., $n_I=4$), the circuit 121 may have any number of transistors 121a connected in series. The circuit 121 may be any circuit that lets pass the direct-current component of the current between the output line 112 and the feedback line 114 and that generates between the output line 112 and the feedback line 114, as the direct-current component of the first division voltage, a voltage commensurate with the direct-current component of that current.

The feedback capacitive element 122 connected in parallel with the circuit 121 is composed of a transistor configured as a P-channel MOSFET. The transistor serving as the feedback capacitive element 122 has its drain, source, and back gate all connected to the output line 112, and has its gate connected to the feedback line 114, so that the transistor functions as a capacitive element. The feedback capacitive element 122 may however be any type of capacitive element, and can be, for example, a capacitive element with a MOM (metal-oxide-metal) structure or a MIM (metal-insulator-metal) structure.

The second voltage divider 104 includes transistors 123 to 125. The transistors 123 to 125 are each an N-channel MOSFET. The transistor 123 is referred to specifically as the particular transistor 123. The drain of the particular transistor 123 and the drain of the transistor 125 are both connected to the feedback line 114. The gate of the transistor 123 is connected to the reference line 113. The reference line 113 is fed with a predetermined reference voltage a1. The reference voltage a1 has a positive direct-current voltage value (e.g., 0.964 V). The power supply circuit 100B includes a buffer 151. The input terminal of the buffer 151 is fed with the reference voltage VREF_I and the output terminal of the buffer 151 is connected to the reference line 113, so that a reference voltage a1 with a voltage value substantially equal to that of the reference voltage VREF_I is applied to the reference line 113. The buffer 151 can be understood to be included among the components of the reference voltage generation circuit 37 in FIG. 2. The reference voltage VREF_I and the reference voltage a1 are lower than the supply voltage VCC.

The source and back gate of the transistor 123 are connected to the drain of the transistor 124. The source and back gate of the transistor 124 are connected to the ground. The power supply circuit 100B includes an inverter 152. The inverter 152 feeds the inversion signal of an on/off control signal CNT_I from the power control circuit 38 (see FIG. 2) to the gate of the transistor 124. The power control circuit 38 controls the gate potential of the transistor 124 using the inverter 152 such that the transistor 124 is on during the power supply operation period PI and is off other than during the power supply operation period PI. The transistor 125 has its gate, source, and back gate connected to the ground. Thus the transistor 125 functions as a capacitive element inserted between the feedback line 114 and the ground. In the feedback voltage generator 102 configured as described above, the particular transistor 123 receives its drain current from the output line 112 via the first voltage divider 103.

The comparator 105 includes transistors 131 to 136, 141, and 142. The inverter 108 includes transistors 143 to 146. The comparator 105 has a differential input stage 106 and an output stage 107. The transistors 131 to 135 constitute the differential input stage 106, and the transistors 141 and 142 constitute the output stage 107. A transistor 137 too can be understood to be included among the components of the comparator 105. A current source 138 is included among the components of the reference current source 37 in FIG. 2. The transistors 133, 134, 136, 141, 143, and 144 are N-channel MOSFETs and the transistors 131, 132, 135, 137, 142, 145, and 146 are P-channel MOSFETs.

The sources and back gates of the transistors 135, 137, 142, 145, and 146 are connected to the power line 111 to receive the supply voltage VCC. The gate and drain of the transistor 137 and the gates of the transistors 135 and 142 are connected together at a predetermined node. The current source 138 produces a constant current I1 that passes from the just-mentioned predetermined node, to which the gate of the transistor 137 etc. are connected, to the ground. The constant current I1 acts as the drain current of the transistor 137. The transistors 137, 135, and 142 constitute a current mirror circuit, so that a current proportional to the drain current of the transistor 137 (hence the constant current I1) passes as the drain current of the transistor 135 and another current proportional to the drain current of the transistor 137 (hence the constant current I1) passes as the drain current of the transistor 142.

The transistors 131 and 132 have a common structure and common characteristics, and the transistors 131 and 132 constitute a differential input pair in the differential input stage 106. The gate of the transistor 131 is connected to the reference line 113 to receive the reference voltage a1, and the gate of the transistor 132 is connected to the feedback line 114 to receive the feedback voltage b1. The sources of the transistors 131 and 132 are connected to the drain of the transistor 135, and the back gates of the transistors 131 and 132 are connected to the power line 111. The drain of the transistor 131, the drain and gate of the transistor 133, and the gate of the transistor 134 are connected together. The sources and back gates of the transistors 133 and 134 are connected to the ground. The drains of the transistors 132 and 134 are connected together at a node 115.

To the node 115 are also connected the gate and the first electrode of the transistor 136 as well as the gate of the transistor 141. The second electrode of the transistor 136 is connected to a node 116, and the back gate of the transistor 136 is connected to the ground. Of the first and second electrodes of the transistor 136, one is the drain and the other is the source. Of the first and second electrodes of the transistor 136, the one to which a higher voltage is applied functions as the drain and the other functions as the source. At least during a period in which the transistor 141 is on, the first electrode of the transistor 136 (the one connected to the node 115) functions as the drain. To the node 116 are also connected the drains of the transistors 141 and 142 and the gates of the transistors 143 and 145. The source and back gate of the transistor 141 are connected to the ground.

The drains of the transistors 145 and 146 and the drain of the transistor 143 are connected together at a node 117. The source of the transistor 143 is connected to the drain of the transistor 144, and the source of the transistor 144 is connected to the ground. The back gates of the transistors 143 and 144 are connected to the ground. The gate of the transistor 144 is fed with a predetermined bias voltage from an unillustrated circuit. The gate of the transistor 146 is fed with another predetermined bias voltage from an unillustrated circuit.

The power supply circuit 100B further includes transistors 153 and 154. The transistors 153 and 154 are each an N-channel MOSFET. The drain of the transistor 153 is connected to the output line 112, and the gate of the transistor 153 is fed with the voltage VP. Thus, when the voltage VP is sufficiently higher than the voltage VI on the output line 112, the transistor 153 is on and the voltage VI on the output line 112 is applied to the source of the transistor 153 (at least during the voltage-stabilized period mentioned above, the transistor 153 is on). In reality, the voltage VI at the source of the transistor 153 is supplied to the memory block 2. The memory block 2 needs to be supplied with voltages VP and VI fulfilling VP>VI, and to meet this need the transistor 153 is provided. If there is no possibility of a reversal of the magnitude relationship between the voltages VP and IV (i.e., such that VP<VI), the transistor 153 may be omitted so that the voltage VI on the output line 112 is supplied directly to the memory block 2. The transistor 154 has its drain, source, and back gate connected to the ground, and has its gate connected to the output line 112. Thus the transistor 154 functions as a capacitive element inserted between the output line 112 and the ground. The transistor 154 may be omitted.

The operation of the power supply circuit 100B will be described. As described above, the feedback line 114 is fed with the feedback voltage b1 commensurate with the output voltage VI, and the feedback voltage b1 is compared with the reference voltage a1 in the comparator 105. As signals that reflect the comparison result, a differential signal c1 appears at the node 115, a comparison result signal d1 appears at the node 116, and an inverted comparison result signal e1 appears at the node 117. The reference voltage VREF_I and the circuit elements within the power supply circuit 100B are designed such that, so long as the feedback voltage b1 is equal to the reference voltage a1, the output voltage VI is substantially equal to the target voltage $VI_{TG}$.

The differential input stage 106 receives at the differential input pair (131 and 132) the reference voltage a1 and the feedback voltage b1, and generates at the node 115 the differential signal c1 commensurate with the difference between the reference voltage a1 and the feedback voltage b1. If the feedback voltage b1 is lower than the reference voltage a1, as the absolute value of the difference between the voltages a1 and b1 increases, the level (potential) of the differential signal c1 rises; if the feedback voltage b1 is higher than the reference voltage a1, as the absolute value of the difference between the voltages a1 and b1 increases, the level (potential) of the differential signal c1 falls. Note however that the upper- and lower-limit levels of the variation range of the differential signal c1 are, respectively, a predetermined positive level lower than the supply voltage VCC and the level of the ground.

The output stage 107 turns the transistor 141 on or off according to the level of the differential signal c1 to thereby binarize the differential signal c1, and generates at the node 116, as the comparison result signal d1, a signal resulting from the binarization (a binary signal reflecting the differential signal c1). The comparison result signal d1 is a binary signal that takes basically either high level or low level except when the feedback voltage b1 and the reference voltage a1 are just equal. When the level of the differential signal c1 rises until the level of the differential signal c1 becomes higher than the gate threshold voltage of the transistor 141, the transistor 141 turns on and the comparison result signal d1 turns to low level. When the level of the differential signal c1 falls until the level of the differential signal c1 becomes lower than the gate threshold voltage of the transistor 141, the transistor 141 turns off and the comparison result signal d1 turns to high level. Thus, a low-level comparison result signal d1 indicates that the feedback voltage b1 is lower than the reference voltage a1, and a high-level comparison result signal d1 indicates that the feedback voltage b1 is higher than the reference voltage a1. The transistor 136 functions as a clamping element that limits the amplitude of the differential signal c1. The function of the transistor 136 will be described in detail later.

The inverter 108 generates, at the node 117, the inverted comparison result signal e1, which is the inversion signal of the comparison result signal d1. If the comparison result signal d1 is at high level, the inverted comparison result signal e1 is at low level; if the comparison result signal d1 is at low level, the inverted comparison result signal e1 is at high level. The high level of the signals d1 and e1 substantially corresponds to the level of the supply voltage VCC, and the low level of the signals d1 and e1 substantially corresponds to the level of the ground. While here the signal d1 is taken as corresponding to the output signal of the comparator 105, instead the signal e1 may be taken as corresponding to the output signal of the comparator 105 (in that case, the inverter 108 is understood to be included among the components of the comparator 105).

The inverted comparison result signal e1 is fed to the output voltage generator 101. Based on the inverted comparison result signal e1, the output voltage generator 101 makes the charge pump circuit CP_I operative or inoperative. Specifically, during the high-level period of the inverted comparison result signal e1, the output voltage generator 101 keeps the charge pump circuit CP_I operative and, during the low-level period of the inverted comparison result signal e1, the output voltage generator 101 keeps the charge pump circuit CP_I inoperative. Instead, the comparison result signal d1 may be fed to the output voltage generator 101. In that case, the inverter 108 can be omitted; the charge pump circuit CP_I can be kept operative during the low-level period of the comparison result signal d1 and inoperative during the high-level period of the comparison result signal d1.

The period in which the charge pump circuit CP_I is operative will be called the operative period of the charge pump circuit CP_I and the period in which the charge pump circuit CP_I is inoperative will be called the inoperative period of the charge pump circuit CP_I. The charge pump circuit CP_I can be configured as a diode charge pump circuit composed of a plurality of diodes and one or more capacitors, and this diode charge pump circuit can be inserted between the power line 111 and the output line 112. Here, the forward direction of each diode in the charge pump circuit CP_I points from the power line 111 to the output line 112. Each diode in the charge pump circuit CP_I can be configured with a diode-connected MOSFET. Since the configuration of a charge pump circuit is well known, no specific illustration or description will be given of its internal configuration.

During the operative period of the charge pump circuit CP_I, which corresponds to the low-level period of the comparison result signal d1, the clock signal from the oscillation circuit 35 (see FIG. 2) is fed to the charge pump circuit CP_I; thus, synchronously with the clock signal, a positive charge is supplied from the power line 111 via each diode in the charge pump circuit CP_I to the output line 112, so that the output voltage VI increases. During the inoperative period of the charge pump circuit CP_I, the supply of the positive charge to the output line 112 is suspended, and the output voltage VI falls gradually due to a leak current and the like in the circuit elements that are supplied with the output voltage VI (including a current through the feedback voltage generator 102).

Now, the differences between the power supply circuit 100A in FIG. 6 and the power supply circuit 100B in FIG. 7 will be described. The main differences between the power supply circuits 100A and 100B include a first to an eighth difference DIF_I described below. Note that the two voltages and the three signals in the power supply circuit 100A in FIG. 6 that correspond to the voltages a1 and b1 and the signals c1, d1, and e1 in the power supply circuit 100B in FIG. 7 will be identified by the symbols a1', b1', c1', d1', and e1' respectively.

The first difference DIF_I: of the power supply circuits 100A and 100B, only the power supply circuit 100B includes the feedback capacitive element 122. Owing to the first difference DIF_I, as compared with the power supply circuit 100A, in the power supply circuit 100B, a change in the output voltage VI is conveyed to the feedback line 114 more quickly. Thus, as compared with the power supply circuit 100A, in the power supply circuit 100B, overshoots and ripples in the output voltage VI can be reduced more effectively.

The second difference DIF_I: the gate of the particular transistor 123 is connected, in the power supply circuit 100A in FIG. 6, to the feedback line 114 and, in the power supply circuit 100B in FIG. 7, to the reference line 113. In the configuration of the power supply circuit 100A in FIG. 6, the serial circuit of the plurality of transistors 121a and the serial circuit of the transistors 123 and 124 divide not only the direct-current component of the output voltage VI but also its alternating-current component. By contrast, in the configuration of the power supply circuit 100B in FIG. 7, through the change of the destination to which the gate of the particular transistor 123 is connected, the alternating-current component of the output voltage VI is transmitted directly to the feedback line 114. As a result, as compared with the power supply circuit 100A, in the power supply circuit 100B, overshoots and ripples in the output voltage VI can be reduced.

The third difference DIF_I: of the power supply circuits 100A and 100B, only the power supply circuit 100B includes the transistor 136. In the power supply circuit 100B, owing to the transistor 136, the upper-limit level of the variation range of the differential signal c1 is limited to a level a very small voltage higher than the gate threshold voltage of the transistor 136. For example, if the gate threshold voltage of the transistor 136 is 1.0 V, the level of the differential signal c1 rises to not higher than about 1.1 V. The lower-limit level of the variation range of the differential signal c1 depends on the characteristics of the differential input stage 106 and has a sufficiently low positive voltage value close to 0 V. Thus the transistor 136 functions as a clamping element that limits the amplitude of the differential signal c1. This clamping element is a rectifying element of which the forward direction points from the node 115 to the node 116 and, in FIG. 7, is configured with a diode-connected transistor 136. The clamping element may however be configured with any diode. To minimize the mirroring effect, the transistor 136 can be given as small dimensions (gate width and gate length) as possible.

The fourth to eighth differences DIF_I, though not clear form FIGS. 6 and 7, will also be described. The fourth difference DIF_I: as compared with the power supply circuit 100A, in the power supply circuit 100B, the transistor 125 is given a reduced gate width and a reduced gate length. The aim is to reduce the delay in the transmission of the variation of the output voltage VI to the feedback line 114.

The fifth difference DIF_I: as compared with the power supply circuit 100A, in the power supply circuit 100B, the input capacitance of the differential input pair (131 and 132) is reduced as a result of the transistors 131 and 132 being given reduced gate widths.

The sixth difference DIF_I: as compared with the power supply circuit 100A, in the power supply circuit 100B, to accommodate the change of the size of the differential input pair (131 and 132), the transistors 133 and 134 are given reduced gate widths and increased gate lengths. Thus, in accordance with the change of the size of the differential input pair (131 and 132), the differential input stage 106 has a higher output resistance, resulting in a higher gain in the differential input stage 106.

The seventh difference DIF_I: as compared with the power supply circuit 100A, in the power supply circuit 100B, the constant current I1 is reduced and thus the drain current in the transistor 137 is reduced; moreover, the transistors 137, 135, and 142 are given reduced gate widths. Accordingly, as compared with the power supply circuit 100A, in the power supply circuit 100B, also the drain currents through the transistors 135 and 142 are reduced.

The eighth difference DIF_I: as compared with the power supply circuit 100A, in the power supply circuit 100B, the transconductance of the output stage 107 is increased as a result of the transistor 141 being given a reduced gate width and a reduced gate length.

Figure 8A:
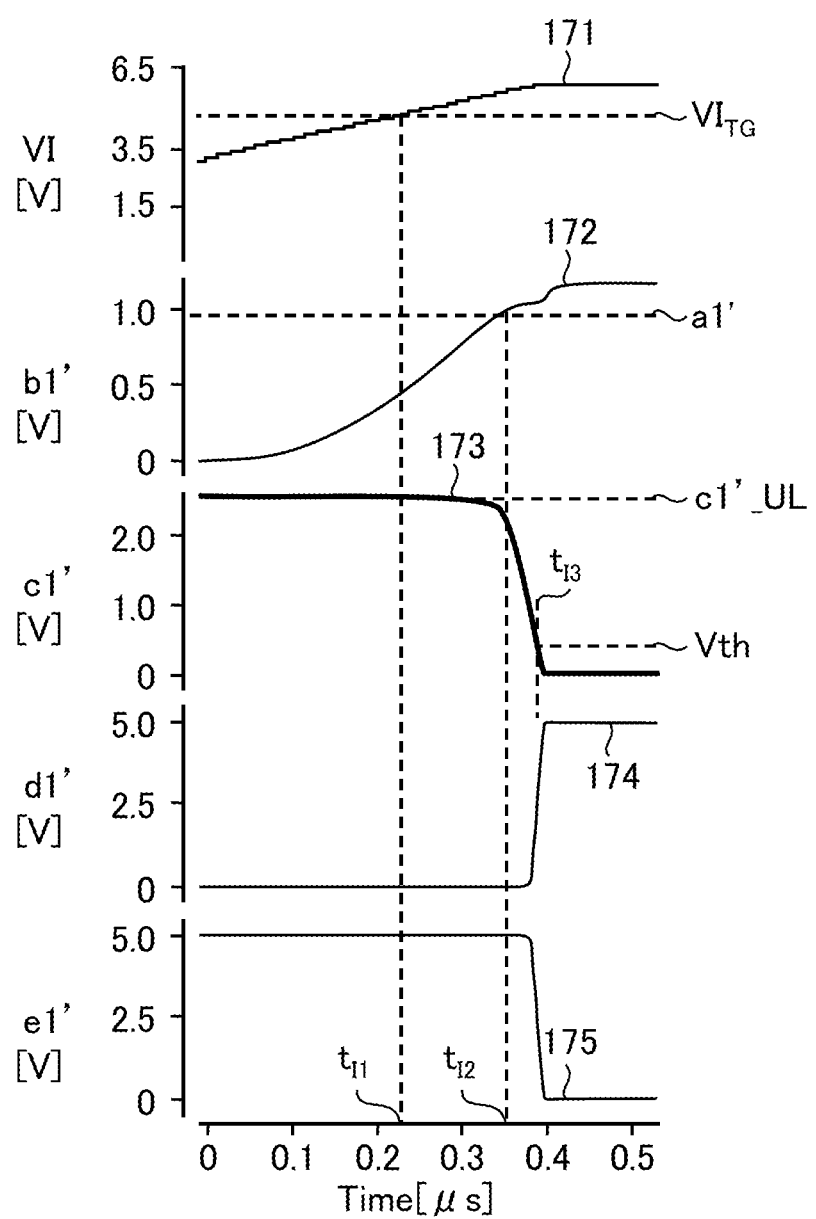
FIG. 8A is a waveform diagram in connection with the power supply circuits in FIGS. 6 and 7.
Figure 8B:
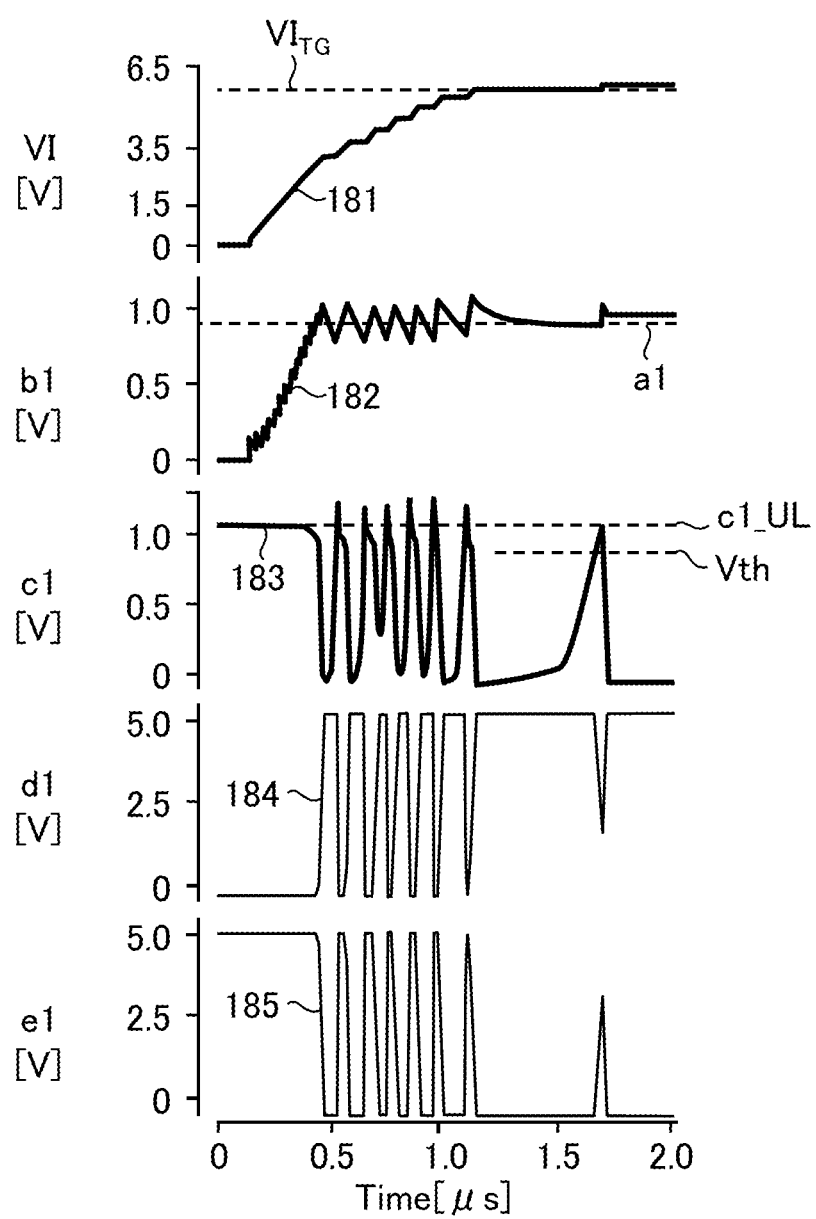
FIG. 8B is a waveform diagram in connection with the power supply circuits in FIGS. 6 and 7.

FIG. 8A shows the signal waveforms at relevant points in the power supply circuit 100A, and FIG. 8B shows the signal waveforms at relevant points in the power supply circuit 100B. In FIG. 8A, the waveforms 171, 172, 173, 174, and 175 are respectively the waveforms of the output voltage VI, the feedback voltage b1', the differential signal c1', the comparison result signal d1', and the inverted comparison result signal e1' in the power supply circuit 100A. In FIG. 8B, the waveforms 181, 182, 183, 184, and 185 are respectively the waveforms of the output voltage VI, the feedback voltage b1, the differential signal c1, the comparison result signal d1, and the inverted comparison result signal e1 in the power supply circuit 100B. The waveforms 171 to 175 and 181 to 185 were observed in a simulation under the condition that the memory block 2 had the second memory capacity (e.g., 2 kilobits). In the simulation, the supply voltage VCC was assumed to be 5 V.

As shown in FIG. 8A, in the power supply circuit 100A, after the start of the power supply operation period PI, the output voltage VI rises from a sufficiently low voltage toward the target voltage $VI_{TG}$ (e.g., 5 V) and reaches the target voltage $VI_{TG}$ only at time point $t_{f1}$. While the output voltage VI is rising, also the feedback voltage b1' rises toward the reference voltage a1'. However, in the power supply circuit 100A, because of a large delay in the transmission of the variation of the output voltage VI to the feedback line 114, at time point $t_{f1}$ the feedback voltage b1' is significantly lower than the reference voltage a1' and it reaches the reference voltage a1' only a while later, at time point $t_{f2}$. In the power supply circuit 100A, at around time point $t_{f2}$, the differential signal c1' starts falling from the upper-limit level c1'_UL of its variation range. After time point $t_{f3}$, at which the level of the differential signal c1' has fallen to or below the gate threshold voltage Vth of the transistor 141, the levels of the signals d1' and e1' are reversed, and the charge pump circuit CP_I stops its operation (i.e., the charge pump circuit CP_I is switched from the operative state to the inoperative state). From time point $t_{f1}$ via time points $t_{f2}$ and $t_{f3}$ until the charge pump circuit CP_I stops operating, the output voltage VI keeps rising, causing a large overshoot.

By contrast, in the power supply circuit 100B, the alternating-current component of the output voltage VI is transmitted to the feedback line 114 more quickly and fully than in the power supply circuit 100A and thus, while the output voltage VI is still rising from a sufficiently low voltage toward the target voltage $VI_{TG}$, the feedback voltage b1 reaches the reference voltage a1. After that, through the repetition of, as a result of the shift from "a1>b1" to "a1<b1", the signals c1, d1, and e1 reversing their levels and the charge pump circuit CP_I stopping its operation and, as a result of the shift from "a1<b1" to "a1>b1", the signals c1, d1, and e1 reversing their levels and the charge pump circuit CP_I restarting its operation, the output voltage VI reaches the target voltage $VI_{TG}$. This operation holds overshoots small.

Moreover, in the power supply circuit 100B, owing to the transistor 136 (clamping element), the upper-limit level c1_UL of the variation range of the differential signal c1 stays at a level only slightly higher than the gate threshold voltage Vth of the transistor 141. At least the upper-limit level c1_UL (e.g., 1.1 V) is lower than the upper-limit level c1'_UL (e.g. 2.5 V) in the power supply circuit 100A. Accordingly, the time that elapses after the shift from "a1>b1" to "a1<b1" until the level of the differential signal c1 falls below the gate threshold voltage Vth is considerably shorter than in the power supply circuit 100A. As a result, the delay time after the shift from "a1>b1" to "a1<b1" until the charge pump circuit CP_I stops operating is shorter. This contributes to reducing overshoots in the output voltage VI.

In the power supply circuit 100B, even after the output voltage VI has reached the target voltage $VI_{TG}$, because the alternating-current component of the output voltage VI is transmitted to the feedback line 114 more quickly and fully than in the power supply circuit 100A, and owing to the transistor 136 (clamping element), ripples in the output voltage VI are held small.

Practical Example EX_2A

Figure 9:
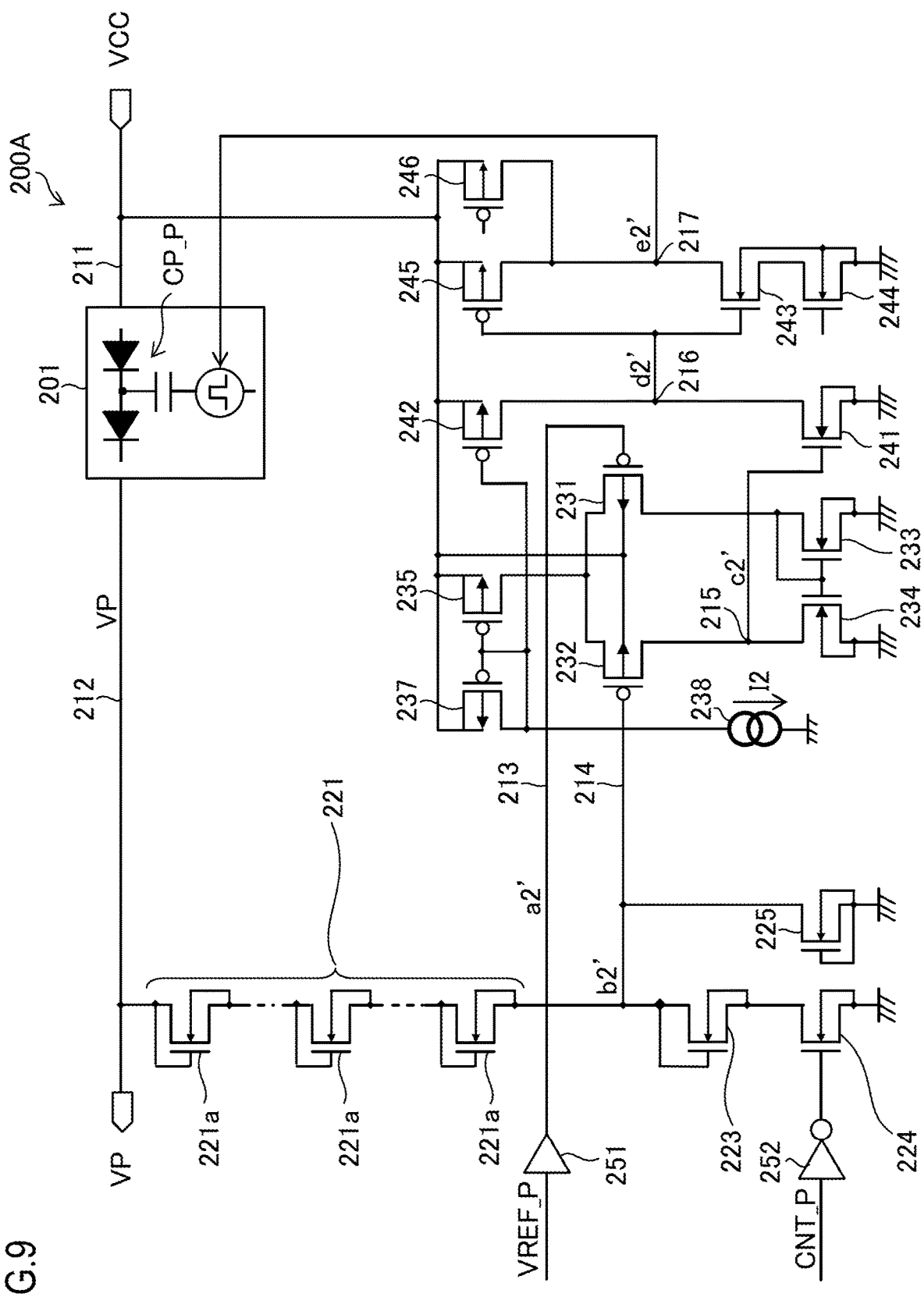
FIG. 9 is a circuit diagram of a power supply circuit according to Practical Example EX_2A belonging to an embodiment of the present disclosure.

Practical Example EX_2A will be described. FIG. 9 is a circuit diagram of a power supply circuit 200A according to Practical Example EX_2A. The power supply circuit 200A is designed as the power supply circuit 32 on the assumption that the memory block 2 has a first memory capacity (e.g., 64 kilobits). When one considers reducing the memory capacity of the memory block 2 from the first memory capacity (e.g., 64 kilobits) to a second memory capacity (e.g., 2 kilobits), the power supply circuit 200A leaves room for improvement in some aspects. The reason for that, as well as the configuration and characteristics of the power supply circuit 200A, will be clarified through the description of Practical Example EX_2B below.

Practical Example EX_2B

Figure 10:
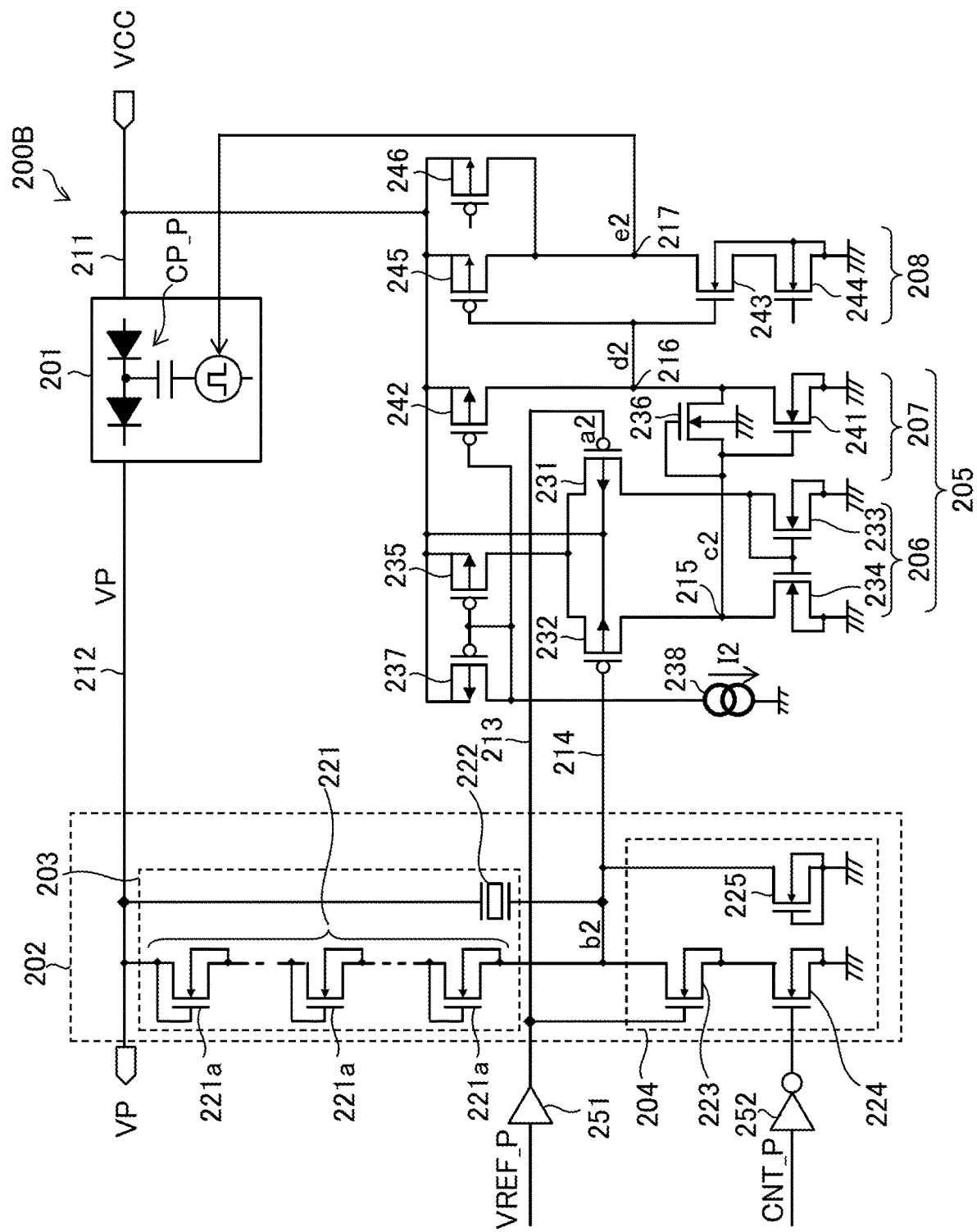
FIG. 10 is a circuit diagram of a power supply circuit according to Practical Example EX_2B belonging to an embodiment of the present disclosure.

Practical Example EX_2B will be described. FIG. 10 is a circuit diagram of a power supply circuit 200B according to Practical Example EX_2B. The power supply circuit 200B is designed as the power supply circuit 32 on the assumption that the memory block 2 has a second memory capacity (e.g., 2 kilobits). Applying to the power supply circuit 200A in FIG. 9 modifications similar to those applied to the power supply circuit 100A in FIG. 6 to obtain the power supply circuit 100B in FIG. 7 gives the power supply circuit 200B in FIG. 10. Unless otherwise stated, the operation of the power supply circuit 200B described in connection with this practical example is the operation of the power supply circuit 200B during the power supply operation period PP.

The power supply circuit 200B includes an output voltage generator 201, a feedback voltage generator 202, a comparator 205, and an inverter 208.

The output voltage generator 201 includes a charge pump circuit CP_P. The output voltage generator 201 is connected to a power line 211 and to an output line 212. The power line 211 is fed with the supply voltage VCC as an input voltage.

The output voltage generator 201 operates the charge pump circuit CP_P to generate, on the output line 212, an output voltage VP higher than the potential of the ground. The output voltage generator 201 can generate, using the supply voltage VCC, the output voltage VP relative to the supply voltage VCC. The supply voltage VCC can be used as a supply voltage to a driver (not illustrated) that feeds the charge pump circuit CP_P with a clock signal (in this case, the amplitude of the clock signal is equal to the magnitude of the supply voltage VCC). The feedback voltage generator 202 is connected to the output line 212, a reference line 213, a feedback line 214, and the ground, and generates, on the feedback line 214, a feedback voltage b2 commensurate with the output voltage VP. The comparator 205 compares the feedback voltage b2 with a predetermined reference voltage a2 to output a comparison result signal that reflects their magnitude relationship. The output voltage generator 201 makes the charge pump circuit CP_P operative or inoperative based on the comparison result signal and thereby stabilizes the output voltage VP at the target voltage $VP_{TG}$.

The feedback voltage generator 202 is configured as follows. The feedback voltage generator 202 includes a first voltage divider 203 arranged between the output line 212, to which the output voltage VP is fed, and the feedback line 214 to generate a first division voltage commensurate with the output voltage VP and a second voltage divider 204 arranged between the feedback line 214 and the ground to generate a second division voltage commensurate with the output voltage VP. The feedback voltage generator 202 thus generates on the feedback line 214, as the feedback voltage b2, a voltage lower than the output voltage VP by the first division voltage. The first division voltage commensurate with the output voltage VP appears between the output line 212 and the feedback line 214, and corresponds to the potential on the output line 212 relative to the potential on the feedback line 214 (i.e., the voltage difference (VP−b2)). The second division voltage commensurate with the output voltage VP appears between the feedback line 214 and the ground, and corresponds to the potential on the feedback line 214 relative to the potential of the ground (i.e., the feedback voltage b2). The output voltage VP corresponds to the sum of the first and second division voltages.

The first voltage divider 203 includes a circuit (DC-pass circuit) 221 that lets pass the direct-current component of the current between the output line 212 and the feedback line 214, and a feedback capacitive element 222 connected in parallel with the circuit 221. The circuit 221 is arranged between the output line 212 and the feedback line 214.

In the configuration example in FIG. 10, the circuit 221 is a series circuit of a plurality of diodes, and the forward direction of each diode in the circuit 221 points from the output line 212 to the feedback line 214. The diodes in the circuit 221 are each configured as a diode-connected MOSFET. That is, the circuit 221 is composed of a plurality of transistors 221a of which each is an N-channel MOSFET, each transistor 221a having its drain and gate connected together (so that each transistor 221a functions as a diode). In each transistor 221a, the back gate is connected to the source. In a case where the circuit 221 is composed of a first to an $n_P$-th transistor 221a (where $n_P$ is any integer of two or more), the drain of the first transistor 221a is connected to the output line 212, the source of the $n_P$-th transistor 221a is connected to the feedback line 214, and the source of the i-th transistor 221a and the drain of the (i+1)th transistor 221a are connected together (where i is any integer fulfilling $1 \leq i \leq (n_P-1)$). The circuit 221 may have any number of transistors 221a connected in series. The circuit 221 may be any circuit that lets pass the direct-current component of the current between the output line 212 and the feedback line 214 and that generates between the output line 212 and the feedback line 214, as the direct-current component of the first division voltage, a voltage commensurate with the direct-current component of that current.

The feedback capacitive element 222 connected in parallel with the circuit 221 is a capacitive element with a MOM (metal-oxide-metal) structure. The feedback capacitive element 222 may however be any type of capacitive element, and may be, for example, a capacitive element with a MIM (metal-insulator-metal) structure. Where no problems are likely in terms of withstand voltage, the feedback capacitive element 222 may be configured with a MOSFET. In that case, for example, an N-channel or P-channel MOSFET can be used as the feedback capacitive element 222, with its drain, source, and back gate all connected to the output line 212 and its gate connected to the feedback line 214.

The second voltage divider 204 includes transistors 223 to 225. The transistors 223 to 225 are each an N-channel MOSFET. The transistor 223 is referred to specifically as the particular transistor 223. The drain of the particular transistor 223 and the drain of the transistor 225 are both connected to the feedback line 214. The gate of the transistor 223 is connected to the reference line 213. The reference line 213 is fed with a predetermined reference voltage a2. The reference voltage a2 has a positive direct-current voltage value (e.g., 1.100 V). The power supply circuit 200B includes a buffer 251. The input terminal of the buffer 251 is fed with the reference voltage VREF_P and the output terminal of the buffer 251 is connected to the reference line 213, so that a reference voltage a2 with a voltage value substantially equal to that of the reference voltage VREF_P is applied to the reference line 213. The buffer 251 can be understood to be included among the components of the reference voltage generation circuit 37 in FIG. 2. The reference voltage VREF_P and the reference voltage a2 are lower than the supply voltage VCC.

The source and back gate of the transistor 223 are connected to the drain of the transistor 224. The source and back gate of the transistor 224 are connected to the ground. The power supply circuit 200B includes an inverter 252. The inverter 252 feeds the inversion signal of an on/off control signal CNT_P from the power control circuit 38 (see FIG. 2) to the gate of the transistor 224. The power control circuit 38 controls the gate potential of the transistor 224 using the inverter 252 such that the transistor 224 is on during the power supply operation period PP and is off other than during the power supply operation period PP. The transistor 225 has its gate, source, and back gate connected to the ground. Thus the transistor 225 functions as a capacitive element inserted between the feedback line 214 and the ground. In the feedback voltage generator 202 configured as described above, the particular transistor 223 receives its drain current from the output line 212 via the first voltage divider 203.

The comparator 205 includes transistors 231 to 236, 241, and 242. The inverter 208 includes transistors 243 to 246. The comparator 205 has a differential input stage 206 and an output stage 207. The transistors 231 to 235 constitute the differential input stage 206, and the transistors 241 and 242 constitute the output stage 207. A transistor 237 too can be understood to be included among the components of the comparator 205. A current source 238 is included among the components of the reference current source 37 in FIG. 2. The transistors 233, 234, 236, 241, 243, and 244 are N-channel MOSFETs and the transistors 231, 232, 235, 237, 242, 245, and 246 are P-channel MOSFETs.

The sources and back gates of the transistors 235, 237, 242, 245, and 246 are connected to the power line 211 to receive the supply voltage VCC. The gate and drain of the transistor 237 and the gates of the transistors 235 and 242 are connected together at a predetermined node. The current source 238 produces a constant current I2 that passes from the just-mentioned predetermined node, to which the gate of the transistor 237 etc. are connected, to the ground. The constant current I2 acts as the drain current of the transistor 237. The transistors 237, 235, and 242 constitute a current mirror circuit, so that a current proportional to the drain current of the transistor 237 (hence the constant current I2) passes as the drain current of the transistor 235 and another current proportional to the drain current of the transistor 237 (hence the constant current I2) passes as the drain current of the transistor 242.

The transistors 231 and 232 have a common structure and common characteristics, and the transistors 231 and 232 constitute a differential input pair in the differential input stage 206. The gate of the transistor 231 is connected to the reference line 213 to receive the reference voltage a2, and the gate of the transistor 232 is connected to the feedback line 214 to receive the feedback voltage b2. The sources of the transistors 231 and 232 are connected to the drain of the transistor 235, and the back gates of the transistors 231 and 232 are connected to the power line 211. The drain of the transistor 231, the drain and gate of the transistor 233, and the gate of the transistor 234 are connected together. The sources and back gates of the transistors 233 and 234 are connected to the ground. The drains of the transistors 232 and 234 are connected together at a node 215.

To the node 215 are also connected the gate and the first electrode of the transistor 236 as well as the gate of the transistor 241. The second electrode of the transistor 236 is connected to a node 216, and the back gate of the transistor 236 is connected to the ground. Of the first and second electrodes of the transistor 236, one is the drain and the other is the source. Of the first and second electrodes of the transistor 236, the one to which a higher voltage is applied functions as the drain and the other functions as the source. At least during a period in which the transistor 241 is on, the first electrode of the transistor 236 (the one connected to the node 215) functions as the drain. To the node 216 are also connected the drains of the transistors 241 and 242 and the gates of the transistors 243 and 245. The source and back gate of the transistor 241 are connected to the ground.

The drains of the transistors 245 and 246 and the drain of the transistor 243 are connected together at a node 217. The source of the transistor 243 is connected to the drain of the transistor 244, and the source of the transistor 244 is connected to the ground. The back gates of the transistors 243 and 244 are connected to the ground. The gate of the transistor 244 is fed with a predetermined bias voltage from an unillustrated circuit. The gate of the transistor 246 is fed with another predetermined bias voltage from an unillustrated circuit.

In the power supply circuit 200B, a transistor that is similar to the transistor 154 in the power supply circuit 100B in FIG. 7 and that functions as a capacitive element may be inserted between the output line 212 and the ground.

The operation of the power supply circuit 200B will be described. As described above, the feedback line 214 is fed with the feedback voltage b2 commensurate with the output voltage VP, and the feedback voltage b2 is compared with the reference voltage a2 in the comparator 205. As signals that reflect the comparison result, a differential signal c2 appears at the node 215, a comparison result signal d2 appears at the node 216, and an inverted comparison result signal e2 appears at the node 217. The reference voltage VREF_P and the circuit elements within the power supply circuit 200B are designed such that, so long as the feedback voltage b2 is equal to the reference voltage a2, the output voltage VP is substantially equal to the target voltage $VP_{TG}$.

The differential input stage 206 receives at the differential input pair (231 and 232) the reference voltage a2 and the feedback voltage b2, and generates at the node 215 the differential signal c2 commensurate with the difference between the reference voltage a2 and the feedback voltage b2. If the feedback voltage b2 is lower than the reference voltage a2, as the absolute value of the difference between the voltages a2 and b2 increases, the level (potential) of the differential signal c2 rises; if the feedback voltage b2 is higher than the reference voltage a2, as the absolute value of the difference between the voltages a2 and b2 increases, the level (potential) of the differential signal c2 falls. Note however that the upper- and lower-limit levels of the variation range of the differential signal c2 are, respectively, a predetermined positive level lower than the supply voltage VCC and the level of the ground.

The output stage 207 turns the transistor 241 on or off according to the level of the differential signal c2 to thereby binarize the differential signal c2, and generates at the node 216, as the comparison result signal d2, a signal resulting from the binarization (a binary signal reflecting the differential signal c2). The comparison result signal d2 is a binary signal that takes basically either high level or low level except when the feedback voltage b2 and the reference voltage a2 are just equal. When the level of the differential signal c2 rises until the level of the differential signal c2 becomes higher than the gate threshold voltage of the transistor 241, the transistor 241 turns on and the comparison result signal d2 turns to low level. When the level of the differential signal c2 falls until the level of the differential signal c2 becomes lower than the gate threshold voltage of the transistor 241, the transistor 241 turns off and the comparison result signal d2 turns to high level. Thus, a low-level comparison result signal d2 indicates that the feedback voltage b2 is lower than the reference voltage a2, and a high-level comparison result signal d2 indicates that the feedback voltage b2 is higher than the reference voltage a2. The transistor 236 functions as a clamping element that limits the amplitude of the differential signal c2. The function of the transistor 236 will be described in detail later.

The inverter 208 generates, at the node 217, the inverted comparison result signal e2, which is the inversion signal of the comparison result signal d2. If the comparison result signal d2 is at high level, the inverted comparison result signal e2 is at low level; if the comparison result signal d2 is at low level, the inverted comparison result signal e2 is at high level. The high level of the signals d2 and e2 substantially corresponds to the level of the supply voltage VCC, and the low level of the signals d2 and e2 substantially corresponds to the level of the ground. While here the signal d2 is taken as corresponding to the output signal of the comparator 205, instead the signal e2 may be taken as corresponding to the output signal of the comparator 205 (in that case, the inverter 208 is understood to be included among the components of the comparator 205).

The inverted comparison result signal e2 is fed to the output voltage generator 201. Based on the inverted comparison result signal e2, the output voltage generator 201 makes the charge pump circuit CP_P operative or inoperative. Specifically, during the high-level period of the inverted comparison result signal e2, the output voltage generator 201 keeps the charge pump circuit CP_P operative and, during the low-level period of the inverted comparison result signal e2, the output voltage generator 201 keeps the charge pump circuit CP_P inoperative. Instead, the comparison result signal d2 may be fed to the output voltage generator 201. In that case, the inverter 208 can be omitted; the charge pump circuit CP_P can be kept operative during the low-level period of the comparison result signal d2 and inoperative during the high-level period of the comparison result signal d2.

The period in which the charge pump circuit CP_P is operative will be called the operative period of the charge pump circuit CP_P and the period in which the charge pump circuit CP_P is inoperative will be called the inoperative period of the charge pump circuit CP_P. The charge pump circuit CP_P can be configured as a diode charge pump circuit composed of a plurality of diodes and one or more capacitors, and this diode charge pump circuit can be inserted between the power line 211 and the output line 212. Here, the forward direction of each diode in the charge pump circuit CP_P points from the power line 211 to the output line 212. Each diode in the charge pump circuit CP_P can be configured with a diode-connected MOSFET. Since the configuration of a charge pump circuit is well known, no specific illustration or description will be given of its internal configuration.

During the operative period of the charge pump circuit CP_P, which corresponds to the low-level period of the comparison result signal d2, the clock signal from the oscillation circuit 35 (see FIG. 2) is fed to the charge pump circuit CP_P; thus, synchronously with the clock signal, a positive charge is supplied from the power line 211 via each diode in the charge pump circuit CP_P to the output line 212, so that the output voltage VP increases. During the inoperative period of the charge pump circuit CP_P, the supply of the positive charge to the output line 212 is suspended, and the output voltage VP falls gradually due to a leak current and the like in the circuit elements that are supplied with the output voltage VP (including a current through the feedback voltage generator 202).

Now, the differences between the power supply circuit 200A in FIG. 9 and the power supply circuit 200B in FIG. 10 will be described. The main differences between the power supply circuits 200A and 200B include a first to an eighth difference DIF_P described below. Note that the two voltages and the three signals in the power supply circuit 200A in FIG. 9 that correspond to the voltages a2 and b2 and the signals c2, d2, and e2 in the power supply circuit 200B in FIG. 10 will be identified by the symbols a2', b2', c2', d2', and e2' respectively.

The first difference DIF_P: of the power supply circuits 200A and 200B, only the power supply circuit 200B includes the feedback capacitive element 222. Owing to the first difference DIF_P, as compared with the power supply circuit 200A, in the power supply circuit 200B, a change in the output voltage VP is conveyed to the feedback line 214 more quickly. Thus, as compared with the power supply circuit 200A, in the power supply circuit 200B, overshoots and ripples in the output voltage VP can be reduced more effectively.

The second difference DIF_P: the gate of the particular transistor 223 is connected, in the power supply circuit 200A in FIG. 9, to the feedback line 214 and, in the power supply circuit 200B in FIG. 10, to the reference line 213. In the configuration of the power supply circuit 200A in FIG. 9, the serial circuit of the plurality of transistors 221a and the serial circuit of the transistors 223 and 224 divide not only the direct-current component of the output voltage VP but also its alternating-current component. By contrast, in the configuration of the power supply circuit 200B in FIG. 10, through the change of the destination to which the gate of the particular transistor 223 is connected, the alternating-current component of the output voltage VP is transmitted directly to the feedback line 214. As a result, as compared with the power supply circuit 200A, in the power supply circuit 200B, overshoots and ripples in the output voltage VP can be reduced.

The third difference DIF_P: of the power supply circuits 200A and 200B, only the power supply circuit 200B includes the transistor 236. In the power supply circuit 200B, owing to the transistor 236, the upper-limit level of the variation range of the differential signal c2 is limited to a level a very small voltage higher than the gate threshold voltage of the transistor 236. For example, if the gate threshold voltage of the transistor 236 is 1.0 V, the level of the differential signal c2 rises to not higher than about 1.1 V. The lower-limit level of the variation range of the differential signal c2 depends on the characteristics of the differential input stage 206 and has a sufficiently low positive voltage value close to 0 V. Thus the transistor 236 functions as a clamping element that limits the amplitude of the differential signal c2. This clamping element is a rectifying element of which the forward direction points from the node 215 to the node 216 and, in FIG. 10, is configured with a diode-connected transistor 236. The clamping element may however be configured with any diode. To minimize the mirroring effect, the transistor 236 can be given as small dimensions (gate width and gate length) as possible.

The fourth to eighth differences DIF_P, though not clear form FIGS. 9 and 10, will also be described. The fourth difference DIF_P: as compared with the power supply circuit 200A, in the power supply circuit 200B, the transistor 225 is given a reduced gate width and a reduced gate length. The aim is to reduce the delay in the transmission of the variation of the output voltage VP to the feedback line 214.

The fifth difference DIF_P: as compared with the power supply circuit 200A, in the power supply circuit 200B, the input capacitance of the differential input pair (231 and 232) is reduced as a result of the transistors 231 and 232 being given reduced gate widths.

The sixth difference DIF_P: as compared with the power supply circuit 200A, in the power supply circuit 200B, to accommodate the change of the size of the differential input pair (231 and 232), the transistors 233 and 234 are given reduced gate widths and increased gate lengths. Thus, in accordance with the change of the size of the differential input pair (231 and 232), the differential input stage 206 has a higher output resistance, resulting in a higher gain in the differential input stage 206.

The seventh difference DIF_P: as compared with the power supply circuit 200A, in the power supply circuit 200B, the constant current I2 is reduced and thus the drain current in the transistor 237 is reduced; moreover, the transistors 237, 235, and 242 are given reduced gate widths. Accordingly, as compared with the power supply circuit 200A, in the power supply circuit 200B, the drain currents through the transistors 235 and 242 are reduced.

The eighth difference DIF_P: as compared with the power supply circuit 200A, in the power supply circuit 200B, the transconductance of the output stage 207 is increased as a result of the transistor 241 being given a reduced gate width and a reduced gate length.

Figure 11A:
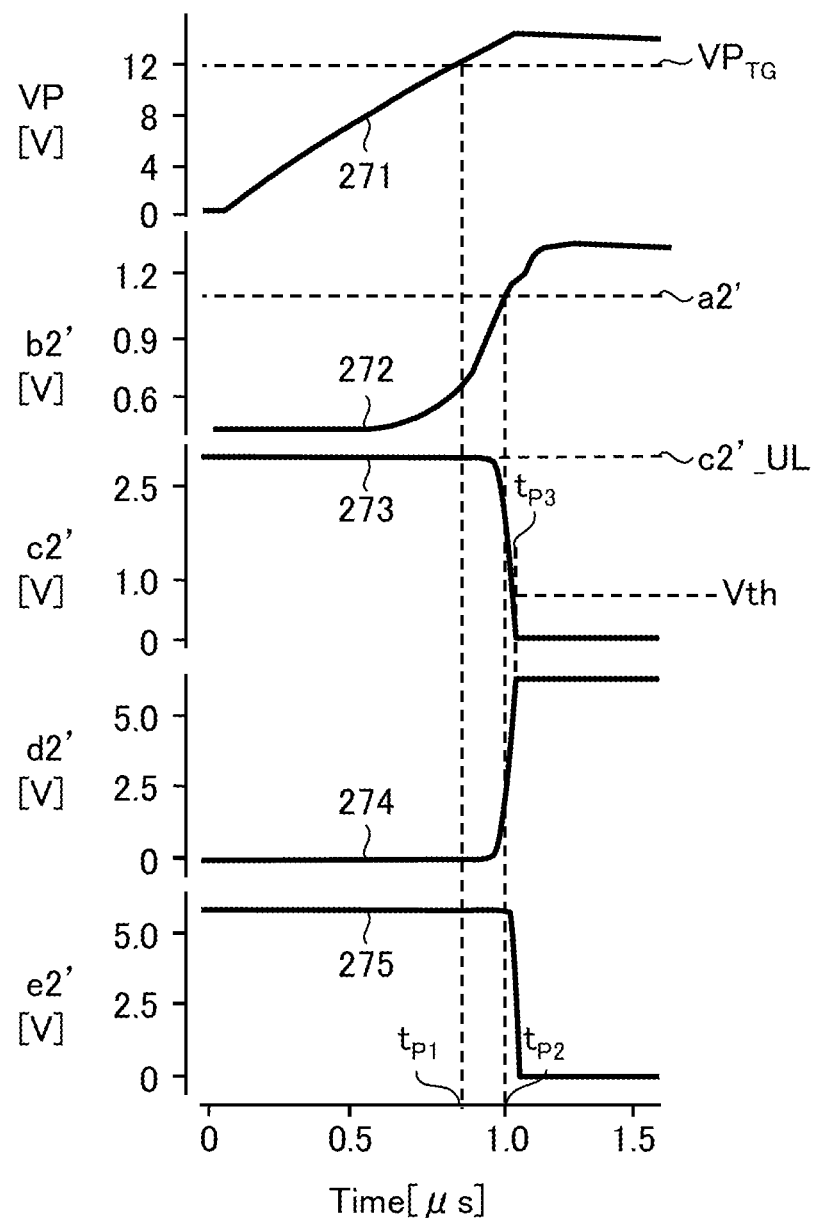
FIG. 11A is a waveform diagram in connection with the power supply circuits in FIGS. 9 and 10.
Figure 11B:
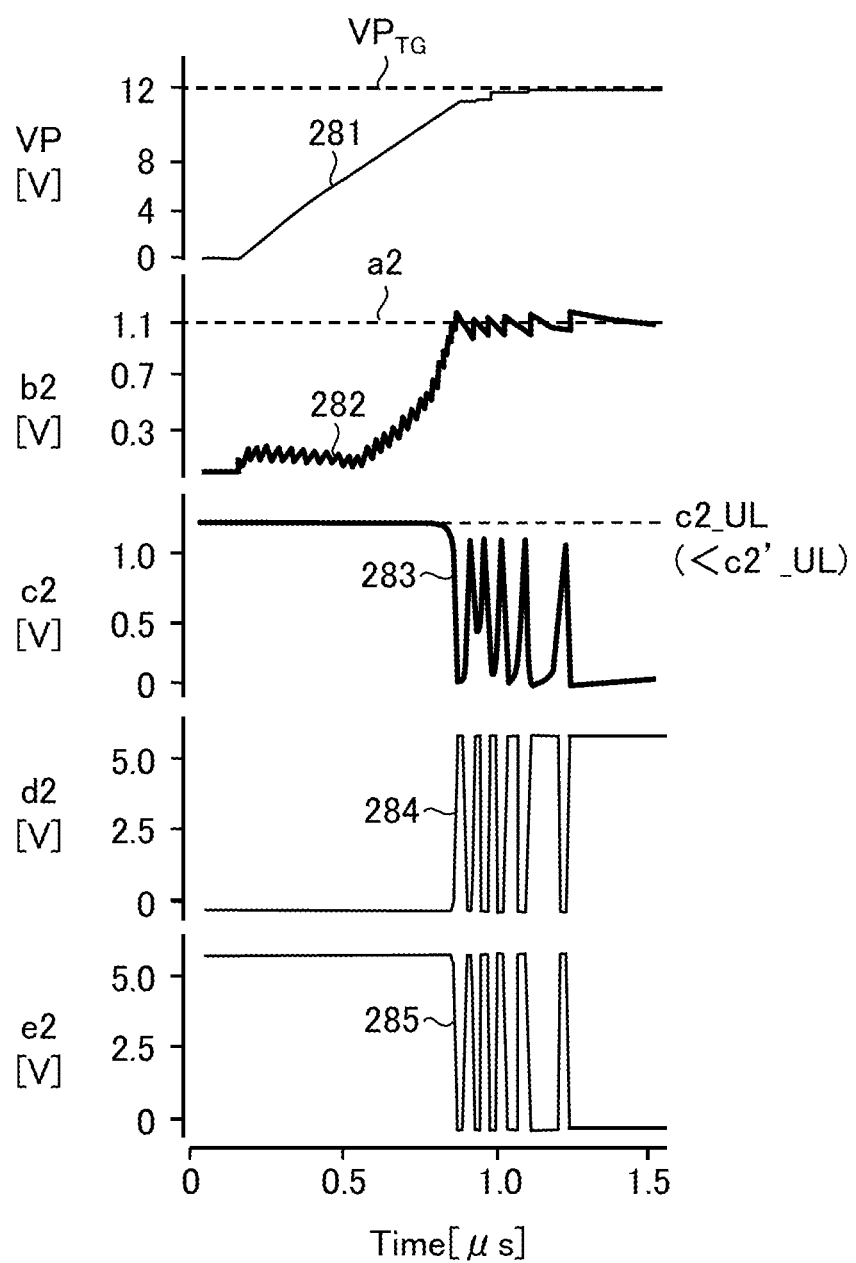
FIG. 11B is a waveform diagram in connection with the power supply circuits in FIGS. 9 and 10.

FIG. 11A shows the signal waveforms at relevant points in the power supply circuit 200A, and FIG. 11B shows the signal waveforms at relevant points in the power supply circuit 200B. In FIG. 11A, the waveforms 271, 272, 273, 274, and 275 are respectively the waveforms of the output voltage VP, the feedback voltage b2', the differential signal c2', the comparison result signal d2', and the inverted comparison result signal e2' in the power supply circuit 200A. In FIG. 11B, the waveforms 281, 282, 283, 284, and 285 are respectively the waveforms of the output voltage VP, the feedback voltage b2, the differential signal c2, the comparison result signal d2, and the inverted comparison result signal e2 in the power supply circuit 200B. The waveforms 271 to 275 and 281 to 285 were observed in a simulation under the condition that the memory block 2 had the second memory capacity (e.g., 2 kilobits). In the simulation, the supply voltage VCC was assumed to be 6 V.

As shown in FIG. 11A, in the power supply circuit 200A, after the start of the power supply operation period PP, the output voltage VP rises from a sufficiently low voltage toward the target voltage $VP_{TG}$ (e.g., 12 V) and reaches the target voltage $VP_{TG}$ only at time point $t_{P1}$. While the output voltage VP is rising, also the feedback voltage b2' rises toward the reference voltage a2'. However, in the power supply circuit 200A, because of a large delay in the transmission of the variation of the output voltage VP to the feedback line 214, at time point $t_{P1}$ the feedback voltage b2' is significantly lower than the reference voltage a2' and it reaches the reference voltage a2' only a while later, at time point $t_{P2}$. In the power supply circuit 200A, at around time point $t_{P2}$, the differential signal c2' starts falling from the upper-limit level c2'_UL of its variation range. After time point $t_{P3}$, at which the level of the differential signal c2' has fallen to or below the gate threshold voltage Vth of the transistor 241, the levels of the signals d2' and e2' are reversed, and the charge pump circuit CP_P stops its operation (i.e., the charge pump circuit CP_P is switched from the operative state to the inoperative state). From time point $t_{P1}$ via time points $t_{P2}$ and $t_{P3}$ until the charge pump circuit CP_P stops operating, the output voltage VP keep rising, causing a large overshoot.

By contrast, in the power supply circuit 200B, the alternating-current component of the output voltage VP is transmitted to the feedback line 214 more quickly and fully than in the power supply circuit 200A and thus, while the output voltage VP is still rising from a sufficiently low voltage toward the target voltage $VP_{TG}$, the feedback voltage b2 reaches the reference voltage a2. After that, through the repetition of, as a result of the shift from "a2>b2" to "a2<b2", the signals c2, d2, and e2 reversing their levels and the charge pump circuit CP_P stopping its operation and, as a result of the shift from "a2<b2" to "a2>b2", the signals c2, d2, and e2 reversing their levels and the charge pump circuit CP_P restarting its operation, the output voltage VP reaches the target voltage $VP_{TG}$. This operation holds overshoots small.

Moreover, in the power supply circuit 200B, owing to the transistor 236 (clamping element), the upper-limit level c2_UL of the variation range of the differential signal c2 stays at a level only slightly higher than the gate threshold voltage Vth of the transistor 241. At least the upper-limit level c2_UL (e.g., 1.3 V) is lower than the upper-limit level c2'_UL (e.g. 3.0 V) in the power supply circuit 200A. Accordingly, the time that elapses after the shift from "a2>b2" to "a2<b2" until the level of the differential signal c2 falls below the gate threshold voltage Vth is considerably shorter than in the power supply circuit 200A. As a result, the delay time after the shift from "a2>b2" to "a2<b2" until the charge pump circuit CP_P stops operating is shorter. This contributes to reducing overshoots in the output voltage VP.

In the power supply circuit 200B, even after the output voltage VP has reached the target voltage $VP_{TG}$, because the alternating-current component of the output voltage VP is transmitted to the feedback line 214 more quickly and fully than in the power supply circuit 200A, and owing to the transistor 236 (clamping element), ripples in the output voltage VP are held small.

Practical Example EX_3A

Figure 12:
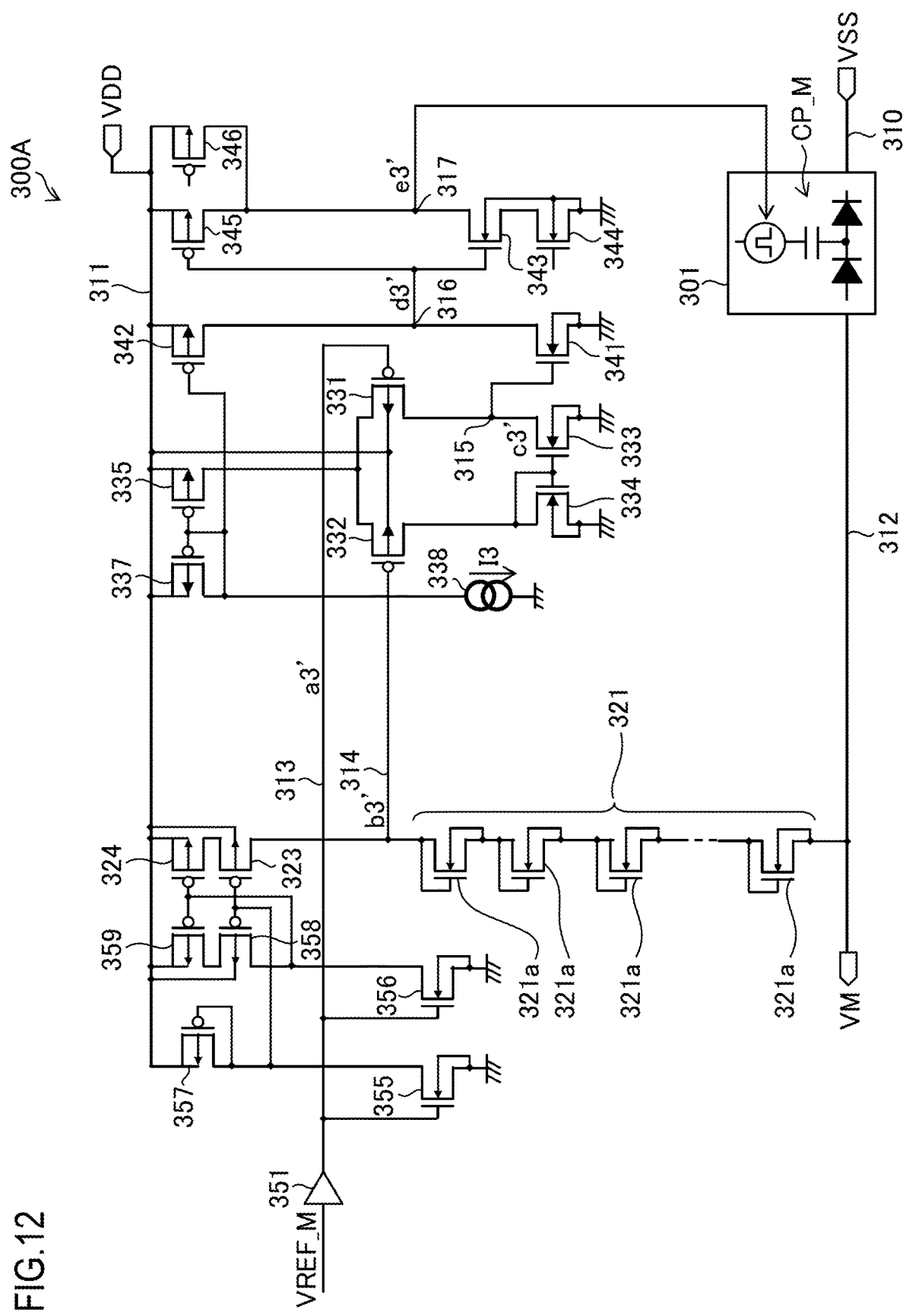
FIG. 12 is a circuit diagram of a power supply circuit according to Practical Example EX_3A belonging to an embodiment of the present disclosure.

Practical Example EX_3A will be described. FIG. 12 is a circuit diagram of a power supply circuit 300A according to Practical Example EX_3A. The power supply circuit 300A is designed as the power supply circuit 33 on the assumption that the memory block 2 has a first memory capacity (e.g., 64 kilobits). When one considers reducing the memory capacity of the memory block 2 from the first memory capacity (e.g., 64 kilobits) to a second memory capacity (e.g., 2 kilobits), the power supply circuit 300A leaves room for improvement in some aspects. The reason for that, as well as the configuration and characteristics of the power supply circuit 300A, will be clarified through the description of Practical Example EX_3B below.

Practical Example EX_3B

Figure 13:
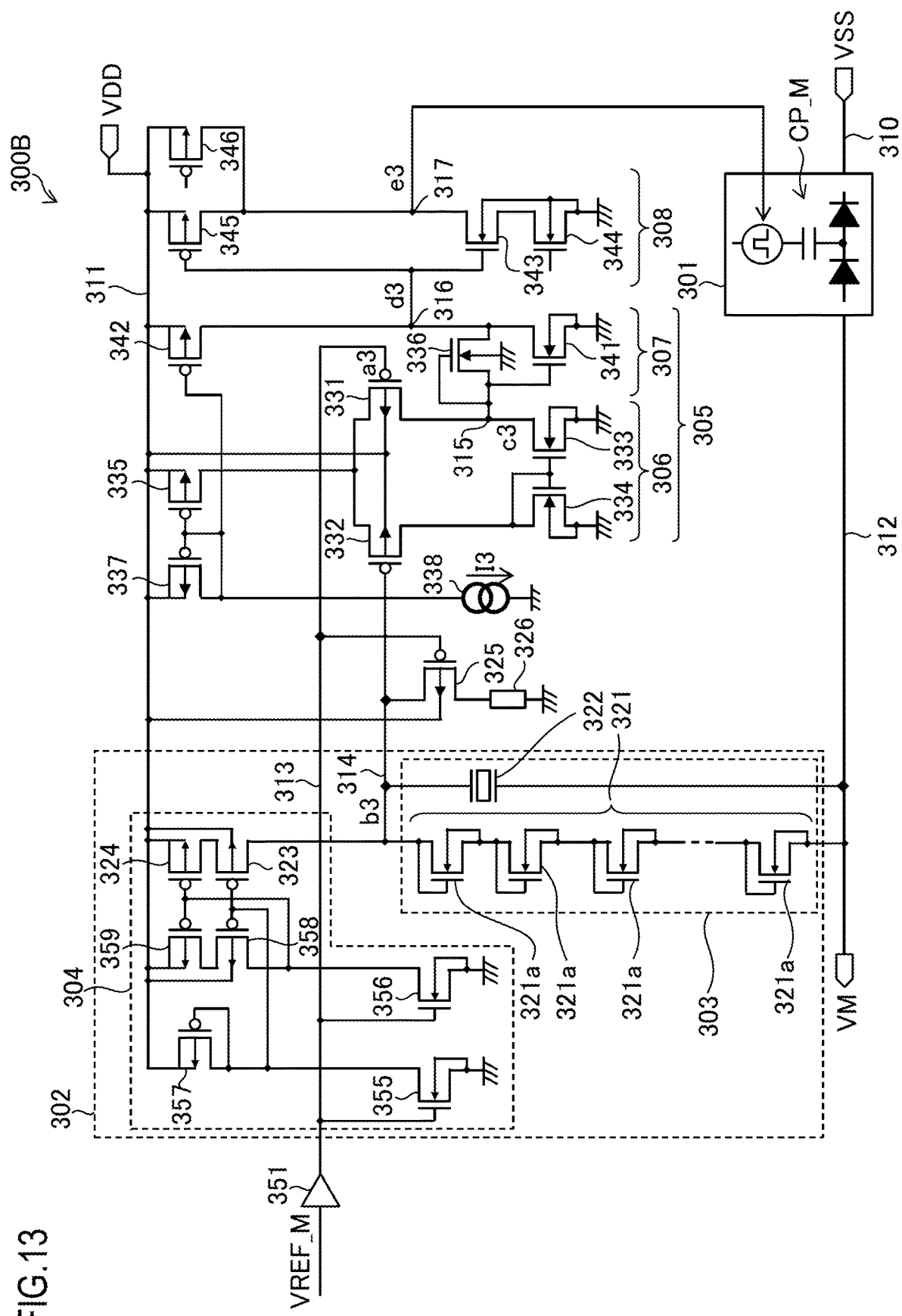
FIG. 13 is a circuit diagram of a power supply circuit according to Practical Example EX_3B belonging to an embodiment of the present disclosure.

Practical Example EX_3B will be described. FIG. 13 is a circuit diagram of a power supply circuit 300B according to Practical Example EX_3B. The power supply circuit 300B is designed as the power supply circuit 33 on the assumption that the memory block 2 has a second memory capacity (e.g., 2 kilobits). Unless otherwise stated, the operation of the power supply circuit 300B described in connection with this practical example is the operation of the power supply circuit 300B during the power supply operation period PM.

The power supply circuit 300B includes an output voltage generator 301, a feedback voltage generator 302, a comparator 305, and an inverter 308.

The output voltage generator 301 includes a charge pump circuit CP_M. The output voltage generator 301 is connected to a reference line 310 and to an output line 312. The reference line 310 is fed with a voltage VSS as an input voltage. The voltage VSS can be any direct-current voltage with a potential higher than the target voltage $VM_{TG}$ (here assumed to be −7 V) of the output voltage VM, and may be the ground.

The output voltage generator 301 operates the charge pump circuit CP_M to generate, on the output line 312, an output voltage VM lower than the potential of the ground. The output voltage generator 301 can generate, using the supply voltage VDD, the output voltage VM relative to the voltage VSS. The supply voltage VDD can be used as a supply voltage to a driver (not illustrated) that feeds the charge pump circuit CP_M with a clock signal (in this case, the amplitude of the clock signal is equal to the magnitude of the supply voltage VDD). The supply voltage VDD is applied to a power line 311. The feedback voltage generator 302 is connected to the output line 312, a reference line 313, a feedback line 314, and the power line 311, and generates, on the feedback line 314, a feedback voltage b3 commensurate with the output voltage VM. The comparator 305 compares the feedback voltage b3 with a predetermined reference voltage a3 to output a comparison result signal that reflects their magnitude relationship. The output voltage generator 301 makes the charge pump circuit CP_M operative or inoperative based on the comparison result signal and thereby stabilizes the output voltage VM at the target voltage $VM_{TG}$.

The feedback voltage generator 302 is configured as follows. The feedback voltage generator 302 includes a first voltage divider 303 arranged between the output line 312, to which the output voltage VM is fed, and the feedback line 314 to generate a first division voltage commensurate with the output voltage VM and a second voltage divider 304 arranged between the feedback line 314 and the power line 311 to generate a second division voltage commensurate with the output voltage VM. The feedback voltage generator 302 thus generates on the feedback line 314, as the feedback voltage b3, a voltage higher than the output voltage VM by the first division voltage. The first division voltage commensurate with the output voltage VM appears between the output line 312 and the feedback line 314, and corresponds to the potential on the feedback line 314 relative to the potential on the output line 312 (i.e., the voltage difference (b3−VM)). The second division voltage commensurate with the output voltage VM appears between the feedback line 314 and the power line 311, and corresponds to the potential on the power line 311 relative to the potential on the feedback line 314 (i.e., the voltage difference (VDD−b3)).

The first voltage divider 303 includes a circuit (DC-pass circuit) 321 that lets pass the direct-current component of the current between the output line 312 and the feedback line 314, and a feedback capacitive element 322 connected in parallel with the circuit 321. The circuit 321 is arranged between the output line 312 and the feedback line 314.

In the configuration example in FIG. 13, the circuit 321 is a series circuit of a plurality of diodes, and the forward direction of each diode in the circuit 321 points from the feedback line 314 to the output line 312. The diodes in the circuit 321 are each configured as a diode-connected MOSFET. That is, the circuit 321 is composed of a plurality of transistors 321a of which each is an N-channel MOSFET, each transistor 321a having its drain and gate connected together (so that each transistor 321a functions as a diode). In each transistor 321a, the back gate is connected to the source. In a case where the circuit 321 is composed of a first to an $n_M$-th transistor (where $n_M$ is any integer of two or more), the source of the first transistor 321a is connected to the output line 312, the drain of the $n_M$-th transistor 321a is connected to the feedback line 314, and the drain of the i-th transistor 321a and the source of the (i+1)th transistor 321a are connected together (where i is any integer fulfilling $1 \le i \le (n_M-1)$). The circuit 321 may have any number of transistors 321a connected in series. The circuit 321 may be any circuit that lets pass the direct-current component of the current between the output line 312 and the feedback line 314 and that generates between the output line 312 and the feedback line 314, as the direct-current component of the first division voltage, a voltage commensurate with the direct-current component of that current.

The feedback capacitive element 322 connected in parallel with the circuit 321 is a capacitive element with a MOM (metal-oxide-metal) structure. The feedback capacitive element 322 may however be any type of capacitive element, and may be, for example, a capacitive element with a MIM (metal-insulator-metal) structure. Where no problems are likely in terms of withstand voltage, the feedback capacitive element 322 may be configured with a MOSFET. In that case, for example, an N-channel or P-channel MOSFET can be used as the feedback capacitive element 322, with its drain, source, and back gate all connected to the output line 312 and its gate connected to the feedback line 314.

The second voltage divider 304 includes transistors 323, 324, and 355 to 359. Of these transistors, the transistors 323, 324, and 357 to 359 are P-channel MOSFETs, and the transistors 355 and 366 are N-channel MOSFETs. The power supply circuit 300B includes a buffer 351. The input terminal of the buffer 351 is fed with the reference voltage VREF_M and the output terminal of the buffer 351 is connected to the reference line 313, so that a reference voltage a3 with a voltage value substantially equal to that of the reference voltage VREF_M is applied to the reference line 313. The buffer 351 can be understood to be included among the components of the reference voltage generation circuit 37 in FIG. 2. The reference voltages VREF_M and a3 have a positive direct-current voltage value (e.g., 1.001 V) lower than the supply voltage VDD.

The sources and back gates of the transistors 324, 357, and 359 are connected to the power line 311. The gate of the transistor 324, the gate of the transistor 329, the drain of the transistor 358, and the drain of the transistor 356 are connected together. The gate of the transistor 323, the gate of the transistor 358, the gate and drain of the transistor 357, and the drain of the transistor 355 are connected together. The back gates of the transistors 323 and 358 are connected to the power line 311. The drain of the transistor 324 is connected to the source of the transistor 323. The drain of the transistor 323 is connected to the feedback line 314. The drain of the transistor 359 is connected to the source of the transistor 358. The gates of the transistors 355 and 356 are connected to the reference line 313. The sources and back gates of the transistors 355 and 356 are connected to the ground.

The power supply circuit 300B further includes a particular transistor 325 and a resistor 326. The particular transistor 325 is configured as a P-channel MOSFET. The particular transistor 325 has its source connected to the feedback line 314, has its gate connected to the reference line 313, has its drain connected to one terminal of the resistor 326, and has its back gate connected to the power line 311. The other terminal of the resistor 326 is connected to the ground.

The comparator 305 includes transistors 331 to 336, 341, and 342. The inverter 308 includes transistors 343 to 346. The comparator 305 has a differential input stage 306 and an output stage 307. The transistors 331 to 335 constitute the differential input stage 306, and the transistors 341 and 342 constitute the output stage 307. A transistor 337 too can be understood to be included among the components of the comparator 305. A current source 338 is included among the components of the reference current source 37 in FIG. 2. The transistors 333, 334, 336, 341, 343, and 344 are N-channel MOSFETs and the transistors 331, 332, 335, 337, 342, 345, and 346 are P-channel MOSFETs.

The sources and back gates of the transistors 335, 337, 342, 345, and 346 are connected to the power line 311 to receive the supply voltage VDD. The gate and drain of the transistor 337 and the gates of the transistors 335 and transistor 342 are connected together at a predetermined node. The current source 338 produces a constant current I3 that passes from the just-mentioned predetermined node, to which the gate of the transistor 337 etc. are connected, to the ground. The constant current I3 acts as the drain current of the transistor 337. The transistors 337, 335, and 342 constitute a current mirror circuit, so that a current proportional to the drain current of the transistor 337 (hence the constant current I3) passes as the drain current of the transistor 335 and another current proportional to the drain current of the transistor 337 (hence the constant current I3) passes as the drain current of the transistor 342.

The transistors 331 and 332 have a common structure and common characteristics, and the transistors 331 and 332 constitute a differential input pair in the differential input stage 306. The gate of the transistor 331 is connected to the reference line 313 to receive the reference voltage a3, and the gate of the transistor 332 is connected to the feedback line 314 to receive the feedback voltage b3. The sources of the transistors 331 and 332 are connected to the drain of the transistor 335, and the back gates of the transistors 331 and 332 are connected to the power line 311. The drain of the transistor 332, the drain and gate of the transistor 334, and the gate of the transistor 333 are connected together. The sources and back gates of the transistors 333 and 334 are connected to the ground. The drains of the transistors 331 and 333 are connected together at a node 315.

To the node 315 are also connected the gate and the first electrode of the transistor 336 as well as the gate of the transistor 341. The second electrode of the transistor 336 is connected to a node 316, and the back gate of the transistor 336 is connected to the ground. Of the first and second electrodes of the transistor 336, one is the drain and the other is the source. Of the first and second electrodes of the transistor 336, the one to which a higher voltage is applied functions as the drain and the other functions as the source. At least during a period in which the transistor 341 is on, the first electrode of the transistor 336 (the one connected to the node 315) functions as the drain. To the node 316 are also connected the drains of the transistors 341 and 342 and the gates of the transistors 343 and 345. The source and back gate of the transistor 341 are connected to the ground.

The drains of the transistors 345 and 346 and the drain of the transistor 343 are connected together at a node 317. The source of the transistor 343 is connected to the drain of the transistor 344, and the source of the transistor 344 is connected to the ground. The back gates of the transistors 343 and 344 are connected to the ground. The gate of the transistor 344 is fed with a predetermined bias voltage from an unillustrated circuit. The gate of the transistor 346 is fed with another predetermined bias voltage from an unillustrated circuit.

In the power supply circuit 300B, a transistor that is similar to the transistor 154 in the power supply circuit 100B in FIG. 7 and that functions as a capacitive element may be inserted between the output line 312 and the ground.

The operation of the power supply circuit 300B will be described. In the second voltage divider 304, the transistors 324 and 359 constitute a current mirror circuit. Currents that depend on the characteristics of the transistors 355 to 359 and the like pass as the drain currents of the transistors 356, 358, and 359 respectively, and the just-mentioned current mirror circuit operates such that a drain current proportional to the drain current of the transistor 359 passes through the transistor 324. However, depending on the level of the output voltage VM (e.g., if the output voltage VM is sufficiently high), no drain current proportional to the drain current of the transistor 359 passes through the transistor 324. When the output voltage VM is stabilized at the target voltage $VM_{TG}$, a drain current proportional to the drain current of the transistor 359 passes through the transistor 324.

As described above, the feedback line 314 is fed with the feedback voltage b3 commensurate with the output voltage VM, and the feedback voltage b3 is compared with the reference voltage a3 in the comparator 305. As signals that reflect the comparison result, a differential signal c3 appears at the node 315, a comparison result signal d3 appears at the node 316, and an inverted comparison result signal e3 appears at the node 317. The reference voltage VREF_M and the circuit elements within the power supply circuit 300B are designed such that, so long as the feedback voltage b3 is equal to the reference voltage a3, the output voltage VM is substantially equal to the target voltage $VM_{TG}$.

The differential input stage 306 receives at the differential input pair (331 and 332) the reference voltage a3 and the feedback voltage b3, and generates at the node 315 the differential signal c3 commensurate with the difference between the reference voltage a3 and the feedback voltage b3. If the feedback voltage b3 is higher than the reference voltage a3, as the absolute value of the difference between the voltages a3 and b3 increases, the level (potential) of the differential signal c3 rises; if the feedback voltage b3 is lower than the reference voltage a3, as the absolute value of the difference between the voltages a3 and b3 increases, the level (potential) of the differential signal c3 falls. Note however that the upper- and lower-limit levels of the variation range of the differential signal c3 are, respectively, a predetermined positive level lower than the supply voltage VDD and the level of the ground.

The output stage 307 turns the transistor 341 on or off according to the level of the differential signal c3 to thereby binarize the differential signal c3, and generates at the node 316, as the comparison result signal d3, a signal resulting from the binarization (a binary signal reflecting the differential signal c3). The comparison result signal d3 is a binary signal that takes basically either high level or low level except when the feedback voltage b3 and the reference voltage a3 are just equal. When the level of the differential signal c3 rises until the level of the differential signal c3 becomes higher than the gate threshold voltage of the transistor 341, the transistor 341 turns on and the comparison result signal d3 turns to low level. When the level of the differential signal c3 falls until the level of the differential signal c3 becomes lower than the gate threshold voltage of the transistor 341, the transistor 341 turns off and the comparison result signal d3 turns to high level. Thus, a low-level comparison result signal d3 indicates that the feedback voltage b3 is higher than the reference voltage a3, and a high-level comparison result signal d3 indicates that the feedback voltage b3 is lower than the reference voltage a3. The transistor 336 functions as a clamping element that limits the amplitude of the differential signal c3. The function of the transistor 336 will be described in detail later.

The inverter 308 generates, at the node 317, the inverted comparison result signal e3, which is the inversion signal of the comparison result signal d3. If the comparison result signal d3 is at high level, the inverted comparison result signal e3 is at low level; if the comparison result signal d3 is at low level, the inverted comparison result signal e3 is at high level. The high level of the signals d3 and e3 substantially corresponds to the level of the supply voltage VDD, and the low level of the signals d3 and e3 substantially corresponds to the level of the ground. While here the signal d3 is taken as corresponding to the output signal of the comparator 305, instead the signal e3 may be taken as corresponding to the output signal of the comparator 305 (in that case, the inverter 308 is understood to be included among the components of the comparator 305).

The inverted comparison result signal e3 is fed to the output voltage generator 301. Based on the inverted comparison result signal e3, the output voltage generator 301 makes the charge pump circuit CP_M operative or inoperative. Specifically, during the high-level period of the inverted comparison result signal e3, the output voltage generator 301 keeps the charge pump circuit CP_M operative and, during the low-level period of the inverted comparison result signal e3, the output voltage generator 301 keeps the charge pump circuit CP_M inoperative. Instead, the comparison result signal d3 may be fed to the output voltage generator 301. In that case, the inverter 308 can be omitted; the charge pump circuit CP_M can be kept operative during the low-level period of the comparison result signal d3 and inoperative during the high-level period of the comparison result signal d3.

The period in which the charge pump circuit CP_M is operative will be called the operative period of the charge pump circuit CP_M and the period in which the charge pump circuit CP_M is inoperative will be called the inoperative period of the charge pump circuit CP_M. The charge pump circuit CP_M can be configured as a diode charge pump circuit composed of a plurality of diodes and one or more capacitors, and this diode charge pump circuit can be inserted between the reference line 310 and the output line 312. Here, the forward direction of each diode in the charge pump circuit CP_M points from the output line 312 to the reference line 310. Each diode in the charge pump circuit CP_M can be configured with a diode-connected MOSFET. Since the configuration of a charge pump circuit is well known, no specific illustration or description will be given of its internal configuration.

During the operative period of the charge pump circuit CP_M, which corresponds to the low-level period of the comparison result signal d3, the clock signal from the oscillation circuit 35 (see FIG. 2) is fed to the charge pump circuit CP_M; thus, synchronously with the clock signal, a positive charge is drawn from the output line 312 via each diode in the charge pump circuit CP_M toward the reference line 310, so that the output voltage VM decreases. During the inoperative period of the charge pump circuit CP_M, the drawing of the positive charge from the output line 312 is suspended, and the output voltage VM rises gradually due to a leak current and the like in the circuit elements that are supplied with the output voltage VM (including a current through the feedback voltage generator 302).

Now, the differences between the power supply circuit 300A in FIG. 12 and the power supply circuit 300B in FIG. 13 will be described. The main differences between the power supply circuits 300A and 300B include a first to a seventh difference DIF_M described below. Note that the two voltages and the three signals in the power supply circuit 300A in FIG. 12 that correspond to the voltages a3 and b3 and the signals c3, d3, and e3 in the power supply circuit 300B in FIG. 13 will be identified by the symbols a3', b3', c3', d3', and e3' respectively.

The first difference DIF_M: of the power supply circuits 300A and 300B, only the power supply circuit 300B includes the feedback capacitive element 322. Owing to the first difference DIF_M, as compared with the power supply circuit 300A, in the power supply circuit 300B, a change in the output voltage VM is conveyed to the feedback line 314 more quickly. Thus, as compared with the power supply circuit 300A, in the power supply circuit 300B, overshoots and ripples in the output voltage VM can be reduced more effectively.

The second difference DIF_M: of the power supply circuits 300A and 300B, only the power supply circuit 300B includes the particular transistor 325 and the resistor 326. The particular transistor 325 and the resistor 326, as their functions will be described later, contribute to reducing undershoots and the like.

The third difference DIF_M: of the power supply circuits 300A and 300B, only the power supply circuit 300B includes the transistor 336. In the power supply circuit 300B, owing to the transistor 336, the upper-limit level of the variation range of the differential signal c3 is limited to a level a very small voltage higher than the gate threshold voltage of the transistor 336. For example, if the gate threshold voltage of the transistor 336 is 1.0 V, the level of the differential signal c3 rises to not higher than about 1.1 V. The lower-limit level of the variation range of the differential signal c3 depends on the characteristics of the differential input stage 306 and has a sufficiently low positive voltage value close to 0 V. Thus the transistor 336 functions as a clamping element that limits the amplitude of the differential signal c3. This clamping element is a rectifying element of which the forward direction points from the node 315 to the node 316 and, in FIG. 13, is configured with a diode-connected transistor 336. The clamping element may however be configured with any diode. To minimize the mirroring effect, the transistor 336 can be given as small dimensions (gate width and gate length) as possible.

The fourth to seventh differences DIF_M, though not clear form FIGS. 12 and 13, will also be described. The fourth difference DIF_M: as compared with the power supply circuit 300A, in the power supply circuit 300B, the input capacitance of the differential input pair (331 and 332) is reduced as a result of the transistors 331 and 332 being given reduced gate widths.

The fifth difference DIF_M: as compared with the power supply circuit 300A, in the power supply circuit 300B, to accommodate the change of the size of the differential input pair (331 and 332), the transistors 333 and 334 are given reduced gate widths and increased gate lengths. Thus, in accordance with the change of the size of the differential input pair (331 and 332), the differential input stage 306 has a higher output resistance, resulting in a higher gain in the differential input stage 306.

The sixth difference DIF_M: as compared with the power supply circuit 300A, in the power supply circuit 300B, the constant current I3 is reduced and thus the drain current in the transistor 337 is reduced; moreover, the transistors 337, 335, and 342 are given reduced gate widths. Accordingly, as compared with the power supply circuit 300A, in the power supply circuit 300B, the drain currents through the transistors 335 and 342 are reduced.

The seventh difference DIF_M: as compared with the power supply circuit 300A, in the power supply circuit 300B, the transconductance of the output stage 307 is increased as a result of the transistor 341 being given a reduced gate width and a reduced gate length.

Figure 14A:
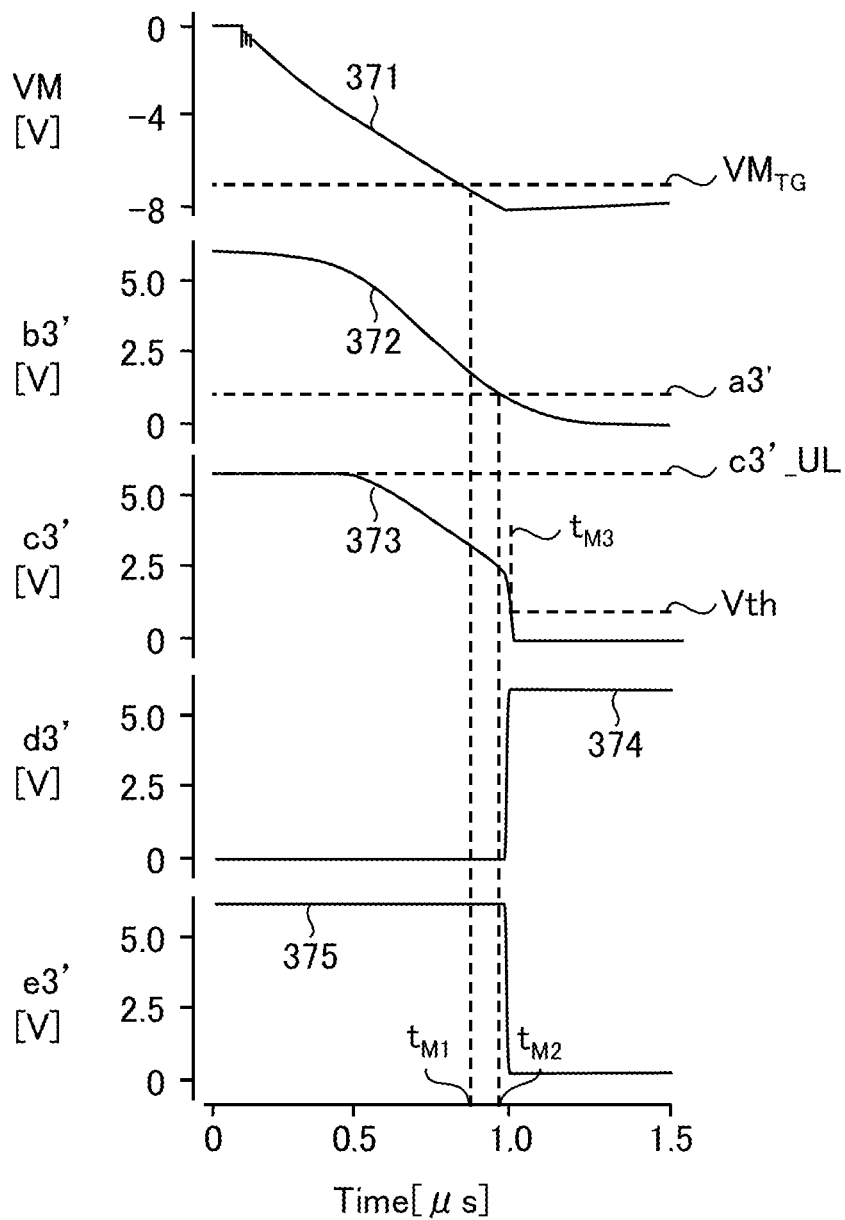
FIG. 14A is a waveform diagram in connection with the power supply circuits in FIGS. 12 and 13.
Figure 14B:
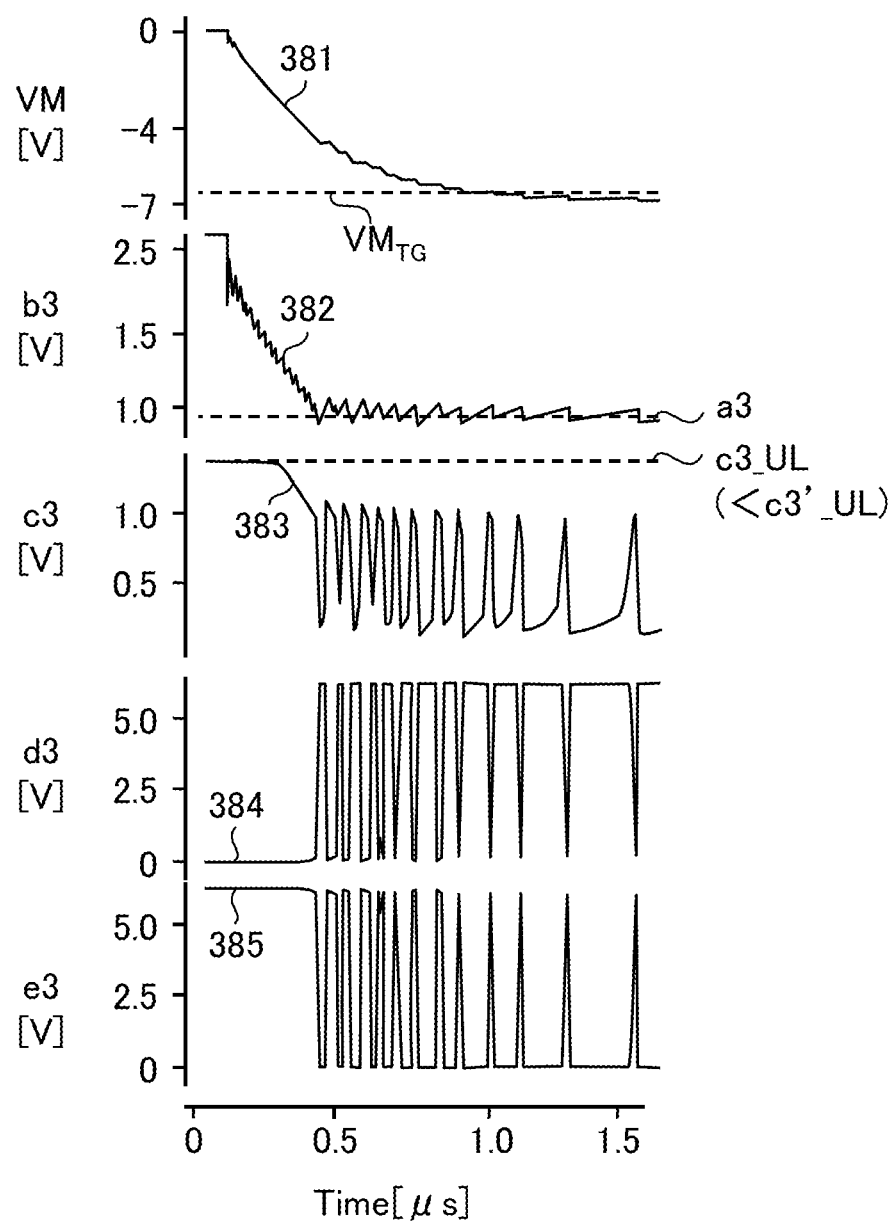
FIG. 14B is a waveform diagram in connection with the power supply circuits in FIGS. 12 and 13.

FIG. 14A shows the signal waveforms at relevant points in the power supply circuit 300A, and FIG. 14B shows the signal waveforms at relevant points in the power supply circuit 300B. In FIG. 14A, the waveforms 371, 372, 373, 374, and 375 are respectively the waveforms of the output voltage VM, the feedback voltage b3', the differential signal c3', the comparison result signal d3', and the inverted comparison result signal e3' in the power supply circuit 300A. In FIG. 14B, the waveforms 381, 382, 383, 384, and 385 are respectively the waveforms of the output voltage VM, the feedback voltage b3, the differential signal c3, the comparison result signal d3, and the inverted comparison result signal e3 in the power supply circuit 300B. The waveforms 371 to 375 and 381 to 385 were observed in a simulation under the condition that the memory block 2 had the second memory capacity (e.g., 2 kilobits). In the simulation, the supply voltage VDD was assumed to be 6 V.

As shown in FIG. 14A, in the power supply circuit 300A, after the start of the power supply operation period PM, the output voltage VM falls from a sufficiently high voltage toward the target voltage $VM_{TG}$ (e.g., −7 V) and reaches the target voltage $VM_{TG}$ only at time point $t_{M1}$. While the output voltage VM is falling, also the feedback voltage b3' falls toward the reference voltage a3'. However, in the power supply circuit 300A, because of a large delay in the transmission of the variation of the output voltage VM to the feedback line 314, at time point $t_{M1}$ the feedback voltage b3' is significantly higher than the reference voltage a3' and it reaches the reference voltage a3' only a while later, at time point $t_{M2}$. In the power supply circuit 300A, from before time point $t_{M2}$, the differential signal c3' starts falling from the upper-limit level c3'_UL of its variation range. After time point $t_{M3}$, at which the level of the differential signal c3' has fallen to or below the gate threshold voltage Vth of the transistor 341, the levels of the signals d3' and e3' are reversed, and the charge pump circuit CP_M stops its operation (i.e., the charge pump circuit CP_M is switched from the operative state to the inoperative state). From time point $t_{M1}$ via time points $t_{M2}$ and $t_{M3}$ until the charge pump circuit CP_M stops operating, the output voltage VM keeps falling, causing a large undershoot.

By contrast, in the power supply circuit 300B, the alternating-current component of the output voltage VM is transmitted to the feedback line 314 more quickly and fully than in the power supply circuit 300A and thus, while the output voltage VM is still falling from a sufficiently high voltage toward the target voltage $VM_{TG}$, the feedback voltage b3 falls down to the reference voltage a3. After that, through the repetition of, as a result of the shift from "a3<b3" to "a3>b3", the signals c3, d3, and e3 reversing their levels and the charge pump circuit CP_M stopping its operation and, as a result of the shift from "a3>b3" to "a3<b3", the signals c3, d3, and e3 reversing their levels and the charge pump circuit CP_M restarting its operation, the output voltage VM reaches the target voltage $VM_{TG}$. This operation holds undershoots small.

Moreover, in the power supply circuit 300B, owing to the transistor 336 (clamping element), the upper-limit level c3_UL of the variation range of the differential signal c3 stays at a level only slightly higher than the gate threshold voltage Vth of the transistor 341. At least the upper-limit level c3_UL is lower than the upper-limit level c3'_UL in the power supply circuit 300A. Accordingly, the time that elapses after the shift from "a3<b3" to "a3>b3" until the level of the differential signal c3 falls below the gate threshold voltage Vth is considerably shorter than in the power supply circuit 300A. As a result, the delay time after the shift from "a3<b3" to "a3>b3" until the charge pump circuit CP_M stops operating is shorter. This contributes to reducing undershoots in the output voltage VM.

In the power supply circuit 300B, even after the output voltage VM has reached the target voltage $VM_{TG}$, because the alternating-current component of the output voltage VM is transmitted to the feedback line 314 more quickly and fully than in the power supply circuit 300A, and owing to the transistor 336 (clamping element), ripples in the output voltage VM are held small.

Next, the functions of the particular transistor 325 and the resistor 326 in the power supply circuit 300B will be described. The particular transistor 325 and the resistor 326 constitute a feedback voltage adjuster. The feedback voltage adjuster so operates that, when the feedback voltage b3 is higher than the reference voltage a3, a current (positive charge) commensurate with the difference between the reference voltage a3 and the feedback voltage b3 is drawn from the feedback line 314 so as to lower the feedback voltage b3. A current being drawn from the feedback line 314 corresponds to a drain current passing through the particular transistor 325. Accordingly, a drop in the feedback voltage b3 resulting from the current drawing occurs only when the feedback voltage b3 is so high that a drain current passes through the particular transistor 325. That is, when the feedback voltage b3 is higher than the reference voltage a3 and in addition a drain current passes through the particular transistor 325, the feedback voltage adjuster draws the drain current (the drain current through the particular transistor 325) from the feedback line 314 and thereby lowers the feedback voltage b3.

The feedback voltage adjuster contributes to suppressing undershoots, and does so markedly when the supply voltage VDD is comparatively high. Suppose that the memory device 1 has such specifications that the value of the supply voltage VDD varies in the range from a lower-limit voltage value $VAL_{MIN}$ to a higher-limit voltage value $VAL_{MAX}$ ($VAL_{MIN} < VAL_{MAX}$). Then a condition where the actual value of the supply voltage VDD is equal or close to the higher-limit voltage value $VAL_{MAX}$ corresponds to a condition where the supply voltage VDD is comparatively high, and this condition will here be called the excess charge state. In the excess charge state, in the power supply circuit 300A in FIG. 12, which has no feedback voltage adjuster, the feedback voltage b3' immediately after the start of the power supply operation period PM (i.e., the initial value of the feedback voltage b3') is comparatively high (in the example in FIG. 14A, about 6 V). Thus, although as the output voltage VM falls the feedback voltage b3' too falls, the feedback voltage b3', due to its initial value being high, takes time to fall down to the reference voltage a3. This leads to or increases undershoots.

By contrast, in the power supply circuit 300B, which has a feedback voltage adjuster, even if immediately after the start of the power supply operation period PM the output voltage VM is substantially 0 V, a drain current passes through the particular transistor 325 so that the feedback voltage b3 does no rise above a given voltage; that is, the initial value of the feedback voltage b3 is held low (in the example in FIG. 14B, about 2.5 V). As a result, after the start of the power supply operation period PM, as the output voltage VM falls the feedback voltage b3 quickly falls down to the reference voltage a3; thus, as compared with the power supply circuit 300A, undershoots are suppressed more effectively.

Practical Example EX_4

Practical Example EX_4 will be described. Practical Example EX_4 deals with applied and modified technologies associated with what has been described above.

Depending on the memory capacity of the memory block 2, the power supply circuit 100A or 100B can be used as the power supply circuit 31, the power supply circuit 200A or 200B can be used as the power supply circuit 32, and the power supply circuit 300A or 300B can be used as the power supply circuit 33. For example, in cases where the memory block 2 has a comparatively high memory capacity, the power supply circuits 100A, 200A and 300A can be used as the power supply circuits 31, 32, and 33; in cases where the memory block 2 has a comparatively low memory capacity, the power supply circuits 100B, 200B and 300B can be used as the power supply circuits 31, 32, and 33. It is however also possible to use, regardless of the memory capacity of the memory block 2, the power supply circuit 100B as the power supply circuit 31, the power supply circuit 200B as the power supply circuit 32, the power supply circuit 300B as the power supply circuit 33.

A semiconductor integrated circuit that includes the memory device 1 along with other functional devices can be accommodated in a single package to form an electronic component (semiconductor device). Examples of such electronic components include power supply components (what is called power ICs), motor drivers, and LED drivers. The memory device 1 alone may be accommodated in a single package to form an electronic component (semiconductor device).

While in the embodiment it is assumed that three voltages VI, VP, and VM are needed as write voltages, depending on the configuration of the memory block 2 the total number of write voltages can be less than three or four or more. In such cases, the power block 3 can generate the needed number of write voltages and the technologies disclosed herein can be applied to the power supply circuits that generate those write voltages.

The technologies disclosed herein, which contribute to reducing overshoots, undershoots, or ripples, can be applied to any one or more of the power supply circuits 31, 32, and 33. While taken as examples above are configurations where the power supply circuits 31, 32, and 33 are included in the memory device 1, any one or more of the power supply circuits 31, 32, and 33 may be incorporated in any device other than the memory device 1. Reducing overshoots, undershoots, or ripples is useful in any device that requires a stabilized voltage.

For any signal or voltage, the relationship between its high and low levels may be reversed so long as that can be done without departure from what has been described above.

The channel type of any of the FETs (field-effect transistors) used in the embodiments is merely illustrative: any circuit including FETs may be modified such that any N-channel FET is replaced with a P-channel FET or that any P-channel FET is replaced with an N-channel FET.

Unless any inconvenience arises, any of the transistors mentioned above may be of any type. For example, unless any inconvenience arises, any transistor mentioned above as a MOSFET may be replaced with a junction FET, an IGBT (insulated-gate bipolar transistor), or a bipolar transistor. Any transistor has a first electrode, a second electrode, and a control electrode. In an FET, of the first and second electrodes one is the drain and the other is the source, and the control electrode is the gate. In an IGBT, of the first and second electrodes one is the collector and the other is the emitter, and the control electrode is the gate. In a bipolar transistor that is not classified as an IGBT, of the first and second electrodes one is the collector and the other is the emitter, and the control electrode is the base.

Studies on the Technologies Disclosed Herein

To follow are supplementary notes on the technology disclosed herein.

According to one aspect of the present disclosure, a power supply device (for convenience' sake, hereinafter referred to as the power supply device $Z_P$; see, e.g., FIG. 7) includes: an output voltage generator (e.g., 101) configured to generate an output voltage (e.g., VI) higher than the potential of the ground by using a charge pump circuit; a feedback voltage generator (e.g., 102) configured to generate on a feedback line (e.g., 114) a feedback voltage (e.g., b1) commensurate with the output voltage; and a comparator (e.g., 105) configured to compare the feedback voltage with a predetermined reference voltage (e.g., a1) to output a comparison result signal (e.g., d1) reflecting the magnitude relationship between the feedback voltage and the reference voltage. The power supply device $Z_P$ stabilizes the output voltage at a predetermined target voltage by making the charge pump circuit operative or inoperative based on the comparison result signal. The feedback voltage generator includes: a first voltage divider (e.g., 103) arranged between an output line (e.g., 112) to which the output voltage is applied and the feedback line, the first voltage divider being configured to generate a first division voltage commensurate with the output voltage; and a second voltage divider (e.g., 104) arranged between the feedback line and the ground, the second voltage divider being configured to generate a second division voltage commensurate with the output voltage. The feedback voltage generator generates on the feedback line, as the feedback voltage, a voltage lower than the output voltage by the first division voltage. The second voltage divider includes an N-channel particular transistor (e.g., 123) having: a gate receiving the reference voltage; and a drain connected to the feedback line.

Specifically, for example, with respect to the power supply device $Z_P$ (see, e.g., FIG. 7), in the first voltage divider, a DC-pass circuit (e.g., 121) configured to let pass the direct-current component of the current between the output line and the feedback line may be arranged between the output line and the feedback line, with a feedback capacitive element (e.g., 122) connected in parallel with the DC-pass circuit. In the second voltage divider, a series circuit of the particular transistor and another transistor (e.g., 124) kept on during the operative period of the power supply device may be arranged between the feedback line and the ground.

For another example, with respect to the power supply device $Z_P$ (see, e.g., FIG. 7), the comparator may have: a differential input stage (e.g., 106) configured to receive the reference voltage and the feedback voltage to generate at a first node (e.g., 115) a differential signal (e.g., c1) commensurate with the difference between the reference voltage and the feedback voltage; and an output stage (e.g., 107) configured to generate at a second node (e.g., 116), as the comparison result signal (e.g., d1), a binary signal reflecting the differential signal. A clamping element (e.g., 136) configured to limit the amplitude of the differential signal may be inserted between the first and second nodes.

Here, for example, with respect to the power supply device $Z_P$ (see, e.g., FIG. 7), the output stage may include a transistor (e.g., 141) having: a gate connected to the first node; and a drain connected to the second node. The transistor may be turned on and off according to the level of the differential signal to generate the comparison result signal at the second node. The clamping element may be configured with a rectifying element of which the forward direction points from the first node to the second node.

With respect to the power supply device $Z_P$ (see, e.g., FIG. 7), the clamping element may be configured with a diode-connected transistor.

According to another aspect of the present disclosure, a power supply device (for convenience' sake, hereinafter referred to as the power supply device $Z_Q$; see, e.g., FIG. 13) includes: an output voltage generator (e.g., 301) configured to generate an output voltage (e.g., VM) lower than the potential of the ground by using a charge pump circuit; a feedback voltage generator (e.g., 302) configured to generate on a feedback line (e.g., 314) a feedback voltage (e.g., b3) commensurate with the output voltage; and a comparator (e.g., 305) configured to compare the feedback voltage with a predetermined reference voltage (e.g., a3) to output a comparison result signal (e.g., d3) reflecting the magnitude relationship between the feedback voltage and the reference voltage. The power supply device stabilizes the output voltage at a predetermined target voltage by making the charge pump circuit operative or inoperative based on the comparison result signal. The comparator includes: a differential input stage (e.g., 306) configured to receive the reference voltage and the feedback voltage to generate at a first node (e.g., 315) a differential signal (e.g., c3) commensurate with the difference between the reference voltage and the feedback voltage; and an output stage (e.g., 307) configured to generate at a second node (e.g., 316), as the comparison result signal (e.g., d3), a binary signal reflecting the differential signal. A clamping element (e.g., 315) configured to limit the amplitude of the differential signal is inserted between the first and second nodes.

Specifically, for example, with respect to the power supply device $Z_Q$ (see, e.g., FIG. 13), the output stage may include a transistor (e.g., 341) having: a gate connected to the first node; and a drain connected to the second node. The transistor may be turned on and off according to the level of the differential signal to generate the comparison result signal at the second node. The clamping element may be configured with a rectifying element of which the forward direction points from the first node to the second node.

With respect to the power supply device $Z_Q$ (see, e.g., FIG. 13), the clamping element may be configured with a diode-connected transistor.

For another example, with respect to the power supply device $Z_Q$ (see, e.g., FIG. 13), the feedback voltage generator may include: a first voltage divider (e.g., 303) arranged between an output line (e.g., 312) to which the output voltage is applied and the feedback line, the first voltage divider being configured to generate a first division voltage commensurate with the output voltage; and a second voltage divider (e.g., 304) arranged between the feedback line and a power line (e.g., 311) to which a predetermined supply voltage (e.g., VDD) is applied, the second voltage divider being configured to generate a second division voltage commensurate with the output voltage. The feedback voltage generator may generate on the feedback line, as the feedback voltage, a voltage higher than the output voltage by the first division voltage. The power supply device may further include a feedback voltage adjuster (e.g., 325, 326) configured, if the feedback voltage is higher than the reference voltage, to lower the feedback voltage by drawing from the feedback line a current commensurate with the difference between the reference voltage and the feedback voltage.

More specifically, for example, with respect to the power supply device $Z_Q$ (see, e.g., FIG. 13), the feedback voltage adjuster may include a P-channel particular transistor (e.g., 325) having: a gate receiving the reference voltage; and a source connected to the feedback line. If the feedback voltage is higher than the reference voltage and in addition a drain current passes through the particular transistor, the feedback voltage adjuster may lower the feedback voltage by drawing the drain current from the feedback line.

For another example, with respect to the power supply device $Z_Q$ (see, e.g., FIG. 13), in the first voltage divider, a circuit (e.g., 321) configured to let pass the direct-current component of the current between the output line and the feedback line may be arranged between the output line and the feedback line, with a feedback capacitive element (e.g., 322) connected in parallel with that circuit.

Embodiments of the present disclosure allow for any modifications as necessary within the scope of technical ideas recited in the appended claims. The embodiments described above are merely examples of implementing the present disclosure, and what is meant by any of the terms used to describe what is disclosed herein and the components of it is not limited to that mentioned in connection with the embodiments. The specific values mentioned in the above description are merely illustrative and needless to say can be modified to different values.

Notes

To follow is an overview of the technical ideas implemented in the embodiments described above.

According to one aspect of the present disclosure, a power supply device includes: an output voltage generator configured to generate an output voltage higher than the potential of the ground by using a charge pump circuit; a feedback voltage generator configured to generate on a feedback line a feedback voltage commensurate with the output voltage; and a comparator configured to compare the feedback voltage with a predetermined reference voltage to output a comparison result signal reflecting the magnitude relationship between the feedback voltage and the reference voltage. The power supply device stabilizes the output voltage at a predetermined target voltage by making the charge pump circuit operative or inoperative based on the comparison result signal. The feedback voltage generator includes: a first voltage divider arranged between an output line to which the output voltage is applied and the feedback line, the first voltage divider being configured to generate a first division voltage commensurate with the output voltage; and a second voltage divider arranged between the feedback line and the ground, the second voltage divider being configured to generate a second division voltage commensurate with the output voltage. The feedback voltage generator generates on the feedback line, as the feedback voltage, a voltage lower than the output voltage by the first division voltage. The second voltage divider includes an N-channel particular transistor having: a gate receiving the reference voltage; and a drain connected to the feedback line. (A first configuration.)

With respect to the power supply device of the first configuration described above, in the first voltage divider, a DC-pass circuit configured to let pass the direct-current component of the current between the output line and the feedback line may be arranged between the output line and the feedback line, with a feedback capacitive element connected in parallel with the DC-pass circuit. In the second voltage divider, a series circuit of the particular transistor and another transistor kept on during the operative period of the power supply device may be arranged between the feedback line and the ground. (A second configuration.)

In the power supply device of the first or second configuration described above, the comparator may have: a differential input stage configured to receive the reference voltage and the feedback voltage to generate at a first node a differential signal commensurate with the difference between the reference voltage and the feedback voltage; and an output stage configured to generate at a second node, as the comparison result signal, a binary signal reflecting the differential signal. A clamping element configured to limit the amplitude of the differential signal may be inserted between the first and second nodes. (A third configuration.)

In the power supply device of the third configuration described above, the output stage may include a transistor having: a gate connected to the first node; and a drain connected to the second node. The transistor may be turned on and off according to the level of the differential signal to generate the comparison result signal at the second node. The clamping element may be configured with a rectifying element of which the forward direction points from the first node to the second node. (A fourth configuration.)

In the power supply device of the fourth configuration described above, the clamping element may be configured with a diode-connected transistor. (A fifth configuration.)

According to another aspect of the present disclosure, a power supply device includes: an output voltage generator configured to generate an output voltage higher than the potential of the ground by using a charge pump circuit; a feedback voltage generator configured to generate on a feedback line a feedback voltage commensurate with the output voltage; and a comparator configured to compare the feedback voltage with a predetermined reference voltage to output a comparison result signal reflecting the magnitude relationship between the feedback voltage and the reference voltage. The power supply device stabilizes the output voltage at a predetermined target voltage by making the charge pump circuit operative or inoperative based on the comparison result signal. The comparator includes: a differential input stage configured to receive the reference voltage and the feedback voltage to generate at a first node a differential signal commensurate with the difference between the reference voltage and the feedback voltage; and an output stage configured to generate at a second node, as the comparison result signal, a binary signal reflecting the differential signal. A clamping element configured to limit the amplitude of the differential signal is inserted between the first and second nodes. (A sixth configuration.)

In the power supply device of any of the first to sixth configurations described above, the comparison result signal may have either a first level indicating that the feedback voltage is lower than the reference voltage or a second level indicating that the feedback voltage is higher than the reference voltage. The output voltage generator keeps the charge pump circuit operative during a period in which the comparison result signal has the first level to raise the output voltage, and keeps the charge pump circuit inoperative during a period in which the comparison result signal has the second level. (A seventh configuration.)

According to yet another aspect of the present disclosure, a power supply device includes: an output voltage generator configured to generate an output voltage lower than the potential of the ground by using a charge pump circuit; a feedback voltage generator configured to generate on a feedback line a feedback voltage commensurate with the output voltage; and a comparator configured to compare the feedback voltage with a predetermined reference voltage to output a comparison result signal reflecting the magnitude relationship between the feedback voltage and the reference voltage. The power supply device stabilizes the output voltage at a predetermined target voltage by making the charge pump circuit operative or inoperative based on the comparison result signal. The comparator includes: a differential input stage configured to receive the reference voltage and the feedback voltage to generate at a first node a differential signal commensurate with the difference between the reference voltage and the feedback voltage; and an output stage configured to generate at a second node, as the comparison result signal, a binary signal reflecting the differential signal. A clamping element configured to limit the amplitude of the differential signal is inserted between the first and second nodes. (An eighth configuration.)

In the power supply device of the eighth configuration described above, the output stage may include a transistor having: a gate connected to the first node; and a drain connected to the second node. The transistor may be turned on and off according to the level of the differential signal to generate the comparison result signal at the second node. The clamping element may be configured with a rectifying element of which the forward direction points from the first node to the second node. (A ninth configuration.)

In the power supply device of the ninth configuration described above, the clamping element may be configured with a diode-connected transistor. (A tenth configuration.)

In the power supply device of any of the eighth to tenth configurations described above, the feedback voltage generator may include: a first voltage divider arranged between an output line to which the output voltage is applied and the feedback line, the first voltage divider being configured to generate a first division voltage commensurate with the output voltage; and a second voltage divider arranged between the feedback line and a power line to which a predetermined supply voltage is applied, the second voltage divider being configured to generate a second division voltage commensurate with the output voltage. The feedback voltage generator may generate on the feedback line, as the feedback voltage, a voltage higher than the output voltage by the first division voltage. The power supply device further comprises a feedback voltage adjuster configured, if the feedback voltage is higher than the reference voltage, to lower the feedback voltage by drawing from the feedback line a current commensurate with the difference between the reference voltage and the feedback voltage. (An eleventh configuration.)

In the power supply device of the eleventh configuration described above, the feedback voltage adjuster may include a P-channel particular transistor having: a gate receiving the reference voltage; and a source connected to the feedback line. If the feedback voltage is higher than the reference voltage and in addition a drain current passes through the particular transistor, the feedback voltage adjuster may lower the feedback voltage by drawing the drain current from the feedback line. (A twelfth configuration.)

With respect to the power supply device of the eleventh or twelfth configuration described above, in the first voltage divider, a DC-pass circuit configured to let pass the direct-current component of the current between the output line and the feedback line may be arranged between the output line and the feedback line, with a feedback capacitive element connected in parallel with the DC-pass circuit. (A thirteenth configuration.)

According to still another aspect of the present disclosure, a power supply device includes: an output voltage generator configured to generate an output voltage lower than the potential of the ground by using a charge pump circuit; a feedback voltage generator configured to generate on a feedback line a feedback voltage commensurate with the output voltage; and a comparator configured to compare the feedback voltage with a predetermined reference voltage to output a comparison result signal reflecting the magnitude relationship between the feedback voltage and the reference voltage. The power supply device stabilizes the output voltage at a predetermined target voltage by making the charge pump circuit operative or inoperative based on the comparison result signal. The feedback voltage generator includes: a first voltage divider arranged between an output line to which the output voltage is applied and the feedback line, the first voltage divider being configured to generate a first division voltage commensurate with the output voltage; and a second voltage divider arranged between the feedback line and a power line to which a predetermined supply voltage is applied, the second voltage divider being configured to generate a second division voltage commensurate with the output voltage. The he feedback voltage generator generates on the feedback line, as the feedback voltage, a voltage higher than the output voltage by the first division voltage. The power supply device further comprises a feedback voltage adjuster configured, if the feedback voltage is higher than the reference voltage, to lower the feedback voltage by drawing from the feedback line a current commensurate with the difference between the reference voltage and the feedback voltage. (A fourteenth configuration.)

In the power supply device of any of the eighth to fourteenth configurations described above, the comparison result signal may have either a first level indicating that the feedback voltage is higher than the reference voltage or a second level indicating that the feedback voltage is lower than the reference voltage. The output voltage generator keeps the charge pump circuit operative during a period in which the comparison result signal has the first level to lower the output voltage, and keeps the charge pump circuit inoperative during a period in which the comparison result signal has the second level. (A fifteenth configuration.)

The invention claimed is:

1. A power supply device, comprising:
an output voltage generator configured to generate an output voltage higher than a potential of a ground by using a charge pump circuit;
a feedback voltage generator configured to generate on a feedback line a feedback voltage commensurate with the output voltage; and
a comparator configured to be connected to the feedback line and to a reference line to which a predetermined reference voltage is applied, the comparator being configured to compare the feedback voltage with a predetermined reference voltage to output a comparison result signal reflecting a magnitude relationship between the feedback voltage and the reference voltage,
the power supply device stabilizing the output voltage at a predetermined target voltage by making the charge pump circuit operative or inoperative based on the comparison result signal,
wherein
the feedback voltage generator includes:
a first voltage divider arranged between an output line to which the output voltage is applied and the feedback line, the first voltage divider being configured to generate a first division voltage commensurate with the output voltage; and
a second voltage divider arranged between the feedback line and the ground, the second voltage divider being configured to generate a second division voltage commensurate with the output voltage,
the feedback voltage generator generating on the feedback line, as the feedback voltage, a voltage lower than the output voltage by the first division voltage, and
the second voltage divider includes an N-channel particular transistor having:
a gate connected directly to the reference line and receiving the reference voltage; and
a drain directly connected to the feedback line,
wherein
in the first voltage divider, a DC-pass circuit configured to let pass a direct-current component of a current between the output line and the feedback line is arranged between the output line and the feedback line, with a feedback capacitive element connected in parallel with the DC-pass circuit, and
in the second voltage divider, a series circuit of the particular transistor and another transistor kept on during an operative period of the power supply device is arranged between the feedback line and the ground.

2. The power supply device according to claim 1, wherein the comparator has:
a differential input stage configured to receive the reference voltage and the feedback voltage to generate at a first node a differential signal commensurate with a difference between the reference voltage and the feedback voltage; and
an output stage configured to generate at a second node, as the comparison result signal, a binary signal reflecting the differential signal, and
a clamping element configured to limit an amplitude of the differential signal is inserted between the first and second nodes.

3. The power supply device according to claim 2, wherein the output stage includes a transistor having:
a gate connected to the first node; and
a drain connected to the second node,
the transistor being turned on and off according to a level of the differential signal to generate the comparison result signal at the second node, and the clamping element is configured with a rectifying element of which a forward direction points from the first node to the second node.

4. The power supply device according to claim 3, wherein the clamping element is configured with a diode-connected transistor.

5. The power supply device according to claim 1, wherein the comparison result signal has either
a first level indicating that the feedback voltage is lower than the reference voltage or
a second level indicating that the feedback voltage is higher than the reference voltage, and
the output voltage generator
keeps the charge pump circuit operative during a period in which the comparison result signal has the first level to raise the output voltage and
keeps the charge pump circuit inoperative during a period in which the comparison result signal has the second level.

6. A power supply device, comprising:
an output voltage generator configured to generate an output voltage lower than a potential of a ground by using a charge pump circuit;
a feedback voltage generator configured to generate on a feedback line a feedback voltage commensurate with the output voltage; and
a comparator configured to compare the feedback voltage with a predetermined reference voltage to output a comparison result signal reflecting a magnitude relationship between the feedback voltage and the reference voltage,
the power supply device stabilizing the output voltage at a predetermined target voltage by making the charge pump circuit operative or inoperative based on the comparison result signal,
wherein
the comparator includes:
a differential input stage configured to receive the reference voltage and the feedback voltage to generate at a first node a differential signal commensurate with a difference between the reference voltage and the feedback voltage; and
an output stage configured to generate at a second node, as the comparison result signal, a binary signal reflecting the differential signal, and
a clamping element configured to limit an amplitude of the differential signal is inserted between the first and second nodes,
wherein
the feedback voltage generator includes:
a first voltage divider arranged between an output line to which the output voltage is applied and the feedback line, the first voltage divider being configured to generate a first division voltage commensurate with the output voltage; and
a second voltage divider arranged between the feedback line and a power line to which a predetermined supply voltage is applied, the second voltage divider being configured to generate a second division voltage commensurate with the output voltage, and
the feedback voltage generator generating on the feedback line, as the feedback voltage, a voltage higher than the output voltage by the first division voltage, and
the power supply device further comprises a feedback voltage adjuster configured, if the feedback voltage is higher than the reference voltage, to lower the feedback voltage by drawing from the feedback line a current commensurate with the difference between the reference voltage and the feedback voltage.

7. The power supply device according to claim 6, wherein the feedback voltage adjuster includes a P-channel particular transistor having:
a gate receiving the reference voltage; and
a source connected to the feedback line, and
if the feedback voltage is higher than the reference voltage and in addition a drain current passes through the particular transistor, the feedback voltage adjuster lowers the feedback voltage by drawing the drain current from the feedback line.

8. The power supply device according to claim 6, wherein in the first voltage divider, a DC-pass circuit configured to let pass a direct-current component of a current between the output line and the feedback line is arranged between the output line and the feedback line, with a feedback capacitive element connected in parallel with the DC-pass circuit.

9. A power supply device, comprising:
an output voltage generator configured to generate an output voltage lower than a potential of a ground by using a charge pump circuit;
a feedback voltage generator configured to generate on a feedback line a feedback voltage commensurate with the output voltage; and
a comparator configured to compare the feedback voltage with a predetermined reference voltage to output a comparison result signal reflecting a magnitude relationship between the feedback voltage and the reference voltage,
the power supply device stabilizing the output voltage at a predetermined target voltage by making the charge pump circuit operative or inoperative based on the comparison result signal,
wherein
the feedback voltage generator includes:
a first voltage divider arranged between an output line to which the output voltage is applied and the feedback line, the first voltage divider being configured to generate a first division voltage commensurate with the output voltage; and
a second voltage divider arranged between the feedback line and a power line to which a predetermined supply voltage is applied, the second voltage divider being configured to generate a second division voltage commensurate with the output voltage,
the feedback voltage generator generating on the feedback line, as the feedback voltage, a voltage higher than the output voltage by the first division voltage, and
the power supply device further comprises a feedback voltage adjuster configured, if the feedback voltage is higher than the reference voltage, to lower the feedback voltage by drawing from the feedback line a current commensurate with a difference between the reference voltage and the feedback voltage.

10. The power supply device according to claim 9, wherein
the comparison result signal has either
a first level indicating that the feedback voltage is higher than the reference voltage or
a second level indicating that the feedback voltage is lower than the reference voltage, and
the output voltage generator keeps the charge pump circuit operative during a period in which the comparison result signal has the first level to lower the output voltage and keeps the charge pump circuit inoperative during a period in which the comparison result signal has the second level.

* * * * *